(12) United States Patent
Keller, III

(10) Patent No.: US 11,069,952 B2
(45) Date of Patent: Jul. 20, 2021

(54) ELECTRONICS CARD INSITU TESTING APPARATUS AND METHOD UTILIZING UNINTENDED RF EMISSION FEATURES

(71) Applicant: NOKOMIS, INC., Charleroi, PA (US)

(72) Inventor: Walter J. Keller, III, Bridgeville, PA (US)

(73) Assignee: NOKOMIS, INC., Charleroi, PA (US)

( * ) Notice: Subject to any disclaimer, the term of this patent is extended or adjusted under 35 U.S.C. 154(b) by 512 days.

(21) Appl. No.: 15/963,325

(22) Filed: Apr. 26, 2018

(65) Prior Publication Data

US 2018/0316082 A1    Nov. 1, 2018

Related U.S. Application Data

(60) Provisional application No. 62/490,281, filed on Apr. 26, 2017.

(51) Int. Cl.
| | |
|---|---|
| H01Q 1/22 | (2006.01) |
| H01Q 1/24 | (2006.01) |
| H01Q 3/02 | (2006.01) |
| H01Q 1/38 | (2006.01) |
| G01R 31/00 | (2006.01) |

(52) U.S. Cl.
CPC ......... *H01Q 1/2275* (2013.01); *G01R 31/002* (2013.01); *H01Q 1/247* (2013.01); *H01Q 1/38* (2013.01); *H01Q 3/02* (2013.01)

(58) Field of Classification Search
CPC ....... H01Q 1/2275; H01Q 3/02; G01R 31/002
See application file for complete search history.

(56) References Cited

U.S. PATENT DOCUMENTS

| | | |
|---|---|---|
| 7,515,094 B2 | 4/2009 | Keller, III |
| 8,063,813 B1 | 11/2011 | Keller |
| 8,537,050 B2 | 9/2013 | Freeman et al. |
| 8,643,539 B2 | 2/2014 | Pauly et al. |
| 8,825,823 B2 | 9/2014 | Keller, III |
| 9,059,189 B2 | 6/2015 | Keller, III et al. |
| 9,285,463 B1 | 3/2016 | Freeman et al. |
| 9,562,962 B2 | 2/2017 | Keller, III |
| 9,658,314 B2 | 5/2017 | Parks et al. |
| 9,851,386 B2 | 12/2017 | Keller, III et al. |
| 2003/0210199 A1* | 11/2003 | Sward .................. H01Q 1/244 343/795 |

(Continued)

*Primary Examiner* — Ab Salam Alkassim, Jr.
(74) *Attorney, Agent, or Firm* — AP Patents; Alexander Pokot

(57) ABSTRACT

A diagnostic apparatus for analysis, testing, inspecting and/or screening an integrated and assembled electrically powered equipment rack and its populated cards and devices for measurement of degree of device aging, improper operation, degradation, condition, and/or Remaining Useful Life (RUL). The device includes an antenna card with a detachably attachable antenna module that can be positioned at a distance from the electrically devices under test and a signal receiver or sensor for examining a signal from the electrically powered device, but especially applied to rackmount supported electronics and/or chassis based electronics. The receiver or sensor collects unintended and/or intended RF energy components emitted by the electrically powered device and performs the above analysis in a response to the acquired signal input while the electrically powered device is active or powered.

18 Claims, 26 Drawing Sheets

(56) References Cited

U.S. PATENT DOCUMENTS

| | | | |
|---|---|---|---|
| 2010/0164519 A1* | 7/2010 | Sellathamby | G01R 1/07307 |
| | | | 324/756.03 |
| 2012/0226463 A1 | 9/2012 | Keller, III et al. | |
| 2013/0328710 A1 | 12/2013 | Keller, III | |
| 2017/0356946 A1* | 12/2017 | Gregory | G01R 31/002 |
| 2018/0321292 A1* | 11/2018 | Bartko | G01R 29/0821 |

* cited by examiner

ELECTRONICS CARD INSITU TESTING APPARATUS AND METHOD UTILIZING UNINTENDED RF EMISSION FEATURES

CROSS REFERENCE TO RELATED APPLICATIONS

The present non-provisional application is related to and claims benefit of and priority from provisional U.S. patent application Ser. No. 62/490,281, titled "Electronics card insitu testing apparatus and method utilizing unintended RF emission features" and filed on Apr. 26, 2017 by Applicant Nokomis Inc., the entire contents of which are hereby incorporated by reference thereto. This present non-provisional application is also related to a co-pending non-provisional application Ser. No. 15/963,232, titled "Electronics equipment testing apparatus and method utilizing unintended RF emission features", and now published as U.S. Pub. 2018-0313877A1, which is incorporated hereby in its entirety by reference thereto.

This document incorporates by reference the entire contents of disclosures and/or teachings of the following documents: U.S. Pat. No. 7,515,094 entitled "Advanced electromagnetic location of electronic equipment"; U.S. Pat. No. 8,063,813 entitled "Active improvised explosive device (IED) electronic signature detection"; U.S. Pat. No. 8,537,050 entitled "Identification and analysis of source emissions through harmonic phase comparison"; U.S. Pat. No. 8,643,539 entitled "Advance manufacturing monitoring and diagnostic tool"; U.S. Pat. No. 8,825,823 entitled "System and method for physically detecting, identifying, diagnosing and geolocating electronic devices connectable to a network"; U.S. Pat. No. 9,059,189 entitled "INTEGRATED CIRCUIT WITH ELECTROMAGNETIC ENERGY ANOMALY DETECTION AND PROCESSING"; US Pub. 2012-0226463 entitled "SYSTEM AND METHOD FOR PHYSICALLY DETECTING COUNTERFEIT ELECTRONICS", now issued as U.S. Pat. No. 10,475,754; U.S. Pat. No. 9,658,314 entitled "SYSTEM AND METHOD FOR GEOLOCATING AND DETECTING SOURCE OF ELECTROMAGNETIC EMISSIONS"; US Pub. 2013-0328710, entitled "Identification and Analysis of Source Emissions through Harmonic Phase Comparison", now issued as U.S. Pat. No. 10,416,286; U.S. Pat. No. 9,285,463 entitled "Method and Apparatus for battle damage assessment of electric or electronic devices"; U.S. Pat. No. 9,851,386 entitled "Method and Apparatus for Detection and Identification of Counterfeit and Substandard Electronics"; and U.S. Pat. No. 9,562,962 entitled "System and Method for Physically Detecting, Identifying, Diagnosing and Geolocating Electronic Devices Connectable to a network".

STATEMENT REGARDING FEDERALLY SPONSORED RESEARCH AND DEVELOPMENT

This invention was made with government support under Small Business Innovation Research (SBIR) Contract FA 8650-16-C-1751 awarded by the United States Air Force. The government has certain rights in this invention.

REFERENCE TO SEQUENCE LISTING, A TABLE, OR A COMPUTER PROGRAM LISTING COMPACT DISC APPENDIX

N/A

BACKGROUND

1. Technical Field

The subject matter relates, in general, to a system and method for detecting functional abnormalities in Electronic Cards and equipment and electronics more generally.

The subject matter recognizes changes, patterns or characteristics in the intended or unintended electromagnetic emissions given off by the electrically powered devices, particularly due to sudden power surges, radiation, mechanical damage, aging or degradation effect.

2. Description of Related Art

Conventionally, employed solutions to the problem of detecting operational abnormalities in Electronic equipment typically utilize methods which are manually observed or are dedicated to non-specific diagnose of failure, such as a watchdog timer timeout. This typically does not detect impending part or equipment failures which can occur before the equipment reaches the end of its Remaining Useful Life (RUL), nor does it detect failure or anomalous operation in subsections, passive components, or the whole range of electronics on a computer card. It also is not easily retrofittable into existing equipment, especially electronics cards equipment populating a chassis and/or in a rack. Further, it is not easily and quickly adaptable to focus on specific regions, chips, or cards of operational electronics equipment.

BRIEF DESCRIPTION OF THE DRAWINGS

FIGS. 1A-1D illustrate exemplary replaceable antenna modules which may offer different RF frequency response characteristics or gain patterns and may quickly replace the antenna module on the antenna card of FIG. 1;

FIGS. 7-7C illustrate an exemplary embodiment of an antenna card;

DESCRIPTION OF FIGURE ELEMENTS

Figure 1:
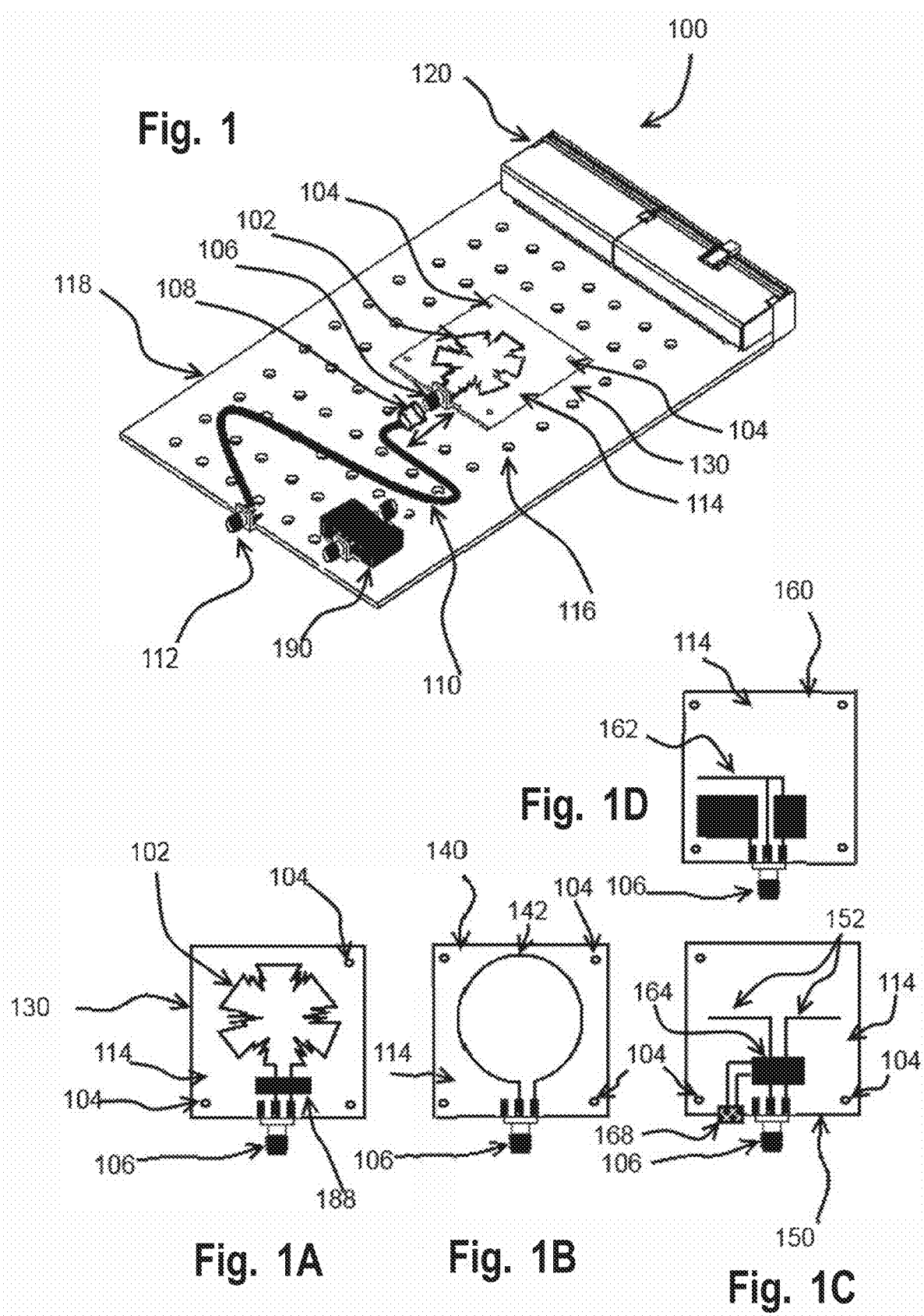
FIG. 1 illustrates an exemplary embodiment of an antenna card.

100—Antenna card insertable into chassis slot containing precisely repositionable antenna
102—Fractal Antenna
104—Registration pin
106—RF Connector
108—RF Connector
110—Coaxial Cable
112—RF Connector
114—Antenna module substrate
116—Registration aperture
118—Card substrate suitable for insertion into chassis slot and which contains precisely movable antenna
120—Back Plane Connector
130—Replaceable antenna module containing fractal-like antenna
140—Replaceable antenna module containing a loop antenna
142—Loop Antenna
150—Replaceable antenna module containing a dipole antenna
152—Dipole Antenna
160—Replaceable antenna module containing a PIFA or inverted-F antenna
162—PIFA or inverted-F antenna
164—LNA
168—LNA Power
188—Impedance Matcher
190—Band Pass Filter
200—Antenna card with manually positionable/repositionable antenna module
202—Fractal antenna
204—Antenna substrate
205—Repositionable, removable, attachment means on bottom surface of the antenna substrate such as adhesive, magnets or velcro
206—RF connector
208—Card substrate
209—Attachment means on top surface of the card substrate such as adhesive, ferrite material, magnets or velcro
210—Axes Motion
212—Backplane connector
214—Conduction cooled contact rails
300—Antenna card with robotically positionable/repositionable antenna module
302—Fractal antenna
304—Antenna module containing antenna and RF connector to antenna
306—Card substrate
308—X-Axis Linear Motor Positioner And X-Axis Position Sensor
310—2nd x-Axis Linear Motor Positioner And X-Axis Position Sensor
312—Y-Axis Linear Motor Positioner And Y-Axis Position Sensor
314—X-Axis Motion
316—Y-Axis Motion
318—Z-Axis Motion
320—Z-Axis Linear Motor Positioner And Z-Axis Position Sensor
330—RF connector
340—Backplane connector
341—Optional RF processor/filter/RF signal logger
342—Optional coax cable
344—Optional SMA female connector to engage 330
400—Antenna card with antenna module(s)
402—First antenna module
402A—Second antenna module
404—Larger antenna etched from antenna substrate
404A—Smaller Antenna etched from antenna substrate
406—Antenna module registration feature
406A—Antenna module registration feature
408—RF Transparent Window
410—Antenna module registration feature
412—Conductive Cooling Rail
414—Card substrate
416—Coaxial Cable
416A—Coaxial Cable
418—RF Connector
418A—RF Connector
420—Backplane Connector
440—Ground Wire
442—Movable RF Shield
444—Shielded Chip Underneath
470—Undesired emission from nearby chip which may interfere with desired emission signal
500—Rack containing computer cards
502—Rackmount Cabinet
504—Antenna module
506—Antenna
508—Emissions Diagnosis Unit 510—Connection between antenna and emissions diagnosis unit
512—Coaxial cable
514—Processor Board
514A—PCB card with components
516—Antenna board—removable, replaceable, as is most/all other PCBs emissions evaluation n related boards in racks or chassis shown herein
520—Intended or unintended emission
522—Intended or unintended emission
524—Emitting Component
526—Emitting Component
540—Empty slot
550—Emitting Component
552—Removable, replaceable PCB
554—Intended or unintended emission
560—Empty slot
560b—Accelerometer or Position Sensor
562—Accelerometer or Position Sensor
564—Accelerometer or Position Sensor
566—Accelerometer or Position Sensor
570—Empty Slot
580—Robotic Positioner and Emissions Diagnosis Unit
582—Robotic Joints Exes
584—Robotic arm
586—Antenna
590—Emitting semiconductor device
592—Intended or unintended Emission
600—system employing emissions sensor card to verify operational health
604—Added Emissions Sensor Card
606—Board Chassis with PE Cards
608—Communication Cable
610—Power connector for chassis
612—Unintended Emission Outside Chassis
614A—Spectrum of Emissions Received by Antenna
614B—Spectrum of Emissions Received by Antenna sent over cable
620—Antenna Receiving Free field, Nearfield and/or Far field Emissions
630—Removal, Addition, Replacement of Card
700—PCB assembly with steerable antenna array
702—PCB card
704—Dipole Antenna as part of Steerable Antenna Array
706—Steerable Antenna Controller and Unintended RF Emissions Diagnosis Module
710—Back Plane Connector
750—PCB assembly with steerable antenna array
752—PCB card
754—Connectors
756—Connectors
758—Dipole Steerable Antenna Array
760—Emissions processor and/or steerable ant array controller
770—Upgradable or Replaceable RF Emissions Diagnosis Module
772—RF Processing Module
774—Connectors to mate with 754
780—Replaceable Antenna Module
782—Antenna
784—Filter
786—LNA
788—Connectors to mate with 756
800—Card showing path of antenna or antenna reception location on a different board as antenna is scanned
802—PCB card substrate
804—Antenna module
806—Path or RF emission reception path of Robotically Moveable Antenna
808—Antenna
810—Connector
900—Antenna board or emissions processor board with MEMS configurable antenna
902—PCB card substrate
904—Antenna Wire Element
906—Antenna MEMS Array Controller
908—Antenna Board Containing MEMS RF Switches
920—MEMs Switch
1000—Chassis or Back Containing Boards to be monitored
1002—Intended/Unintended Emissions Monitoring Board
1004—Antenna
1006—Emissions processor module
1010—Previously Empty Slot to be used to House Antenna Board to Receive Unintended Emissions
1020—Emitting semiconductor device
1024—Emission to 1004
1036—Coaxial Connector
1038—Coaxial Cable
1040—Connection or Disconnection of Added Antenna Board
1048—One or more PCB assemblies to be monitored
1050—Unintended Emissions
1052—Chips Emitting Unintended Emissions to be Monitored
1100—Mobile communication device
1102—RF module assembly
1104—Antenna module
1106—Die
1108—Controller
1110—RF connector
1120—Housing
1122—Display
1124—Camera
1130—Processor
1132—Memory with executable instructions
1200—Controller assembly
1202—PCB or controller enclosure
1204—Intended or unintended RF emissions
1206—Antenna
1208—LNA
1210—Splitter
1212—Tuner
1214—ADC
1216—FPGA/CPU
1218—RAM Memory
1220—Ethernet Physical Controller
1222—Connector
1230—Display Controller
1232—Keyboard Controller
1234—Wi-Fi Controller
1236—WI-Fi transceiver and antenna
1238—Eprom/EEPROM/Program Memory
1250—USB PHY
1260—Power/LDO's
1270—Clock/Clock Dist
1302—Card Rack
1304—Processor Card Containing Chips to be Monitored and Emitting Emissions
1306—Chip Emitting Emissions Upwards and Downwards Through the Board
1308—Emissions
1309—Emissions
1310—RF Emissions Processor Module 1314—Wi-Fi Communication to Outside World Communicating System and Chips Status Based on Emissions Received
1322—Communication Cable Connector, for example RJ45
1324—Communication Cable to Outside World Communicating System and Chips Status Based on Emissions Received
1340—Trace element
1404—RF Emission from Mosfet Leads (and Unintended Emissions)
1408—RF Processor Module Receiving Unintended Emissions
1410—Power and Communications Traces into Board and Card Edge Connectors
1412—FET
1414—Emissions Directed Away from RF Processor Module
1416—Microprocessor Emitting Emissions
1418—RAM or ROM Memory
1502—Laptop
1504—Laptop Processor
1506—RF Emission
1508—RF Emission Processing Module
1510—Logic device
1512—Logic device
1514—Laptop Screen
1600—RF receiving and processing module
1602—Substrate
1604—Connector
1606—Clock/Clock dist
1612—LNA
1614—Splitter
1616—ADC
1618—Power
1620—RAM Memory
1622—USB PHY
1624—Eprom/EEPROM/Program Memory
1626—FPGA/CPU
1628—Display Controller
1630—Keyboard Controller
1650—Tuner
1706—Low Noise Amplifier
1708—Tuner
1710—Analog to Digital Converter
1712—DDC
1714—Frequency Domain Fourier Transforms
1716—CIC Filter
1718—Wavelet De-Noise
1720—Frequency Domain: Integration across time and/or frequency bins
1722—Frequency Domain: Pattern enhance, noise cancellation
1724—Create Signature
1726—Frequency Domain Signal Processing Pattern Recognition against known signature baseline pattern
1728—Criteria Acceptance Determination and Outside World Communication
1730—GUI and/or Network IFCE
1800—Spectrum
1802—Center Peak
1804—Noise Floor of Spectrum
1806—Peak Amplitude
1808—Peak Position
1810—Frequency Range
1900—Spectrum that Exhibits Cross Modulation Content/Amplitude Envelope of Peaks
1902—Center Peak
1904—Cross Modulation Content/Amplitude Envelope of Peaks
1906—Cross Modulation Content/Amplitude Envelope of Peaks
1908—Cross Modulation Content/Amplitude Envelope of Peaks
1910—Cross Modulation Content/Amplitude Envelope of Peaks
1920—Frequency Spacing Between the Center Peak and each Subsequent Cross Modulation Product
2000—unaged
2002—unaged
2050—aged
2052—aged
2100—Electromagnetic Spectrum Showing the 15th Harmonic
2102—The 15th Harmonic, Especially the Peak Height Characteristic for Comparison with the 16th Harmonic Peak
2104—Frequency position of the higher order harmonics
2150—Electromagnetic Spectrum Showing the Region Around the 16th Harmonic
2152—The 16th Harmonic Peak, Especially Peak Height Characteristic for Comparison with the 15th Harmonic Peak
2154—Frequency Position of the Higher Order Harmonics
2200—Assembly
2202—Connector
2204—PCB substrate
2206—LNA
2208—Splitter
2210—Connection node
2212—Connection path
2214—Display Controller
2216—Keyboard Controller
2218—FPGA/CPU
2220—Tuner
2222—Clock/Clock dist
2224—RAM Memory
2226—Eprom/EEPROM/Program Memory
2228—USB PHY
2230—Power
2240—Connector
2260—ADC
2302—Slot 1,2,3,4 (Backplane Connector)
2304—PCB assembly
2306—Electronic component
2308—Unintended RF Emissions Coupled Into Back Plane Traces
2310—PIRQA Exemplary Interrupt Lines, Some May Be Unused
2312—PIRQB Exemplary Interrupt Lines, Some May Be Unused
2314—PIRQC Exemplary Interrupt Lines, Some May Be Unused
2316—PIRQD Exemplary Interrupt Lines, Some May Be Unused
2320—Connection between card slots
2322—Connection between card slots
2324—Unused or Seldom used Back Plane Traces
2340—RF Processor Board Examining Unintended Emissions from Back Plane Traces
2370—Wi-Fi Signal
2374—Computer Monitoring RF Emissions Results Status
2380—Ethernet Optionally Sending RF Emissions Results Status
2400—Antenna Card Assembly 2402—Positionable Antenna
2404—Registration feature
2406—RF Connector
2408—RF Connector
2410—Coaxial Cable
2412—RF Connector
2414—Substrate
2416—Registration feature
2418—PCB card
2430—Antenna module
2450—RF Splitter
2452—RF Connector
2456—$2^{nd}$ Positionable Antenna
2458—2d antenna substrate
2460—Coaxial cable
2502—Edge connector
2504—Ethernet Physical Controller OR Digital communication
2506—Antenna
2508—LNA
2510—Splitter (optional)
2512—Tuner
2514—ADC
2516—FPGA/CPU
2518—RAM Memory
2520—Eprom/EEPROM/Program Memory
2522—LDO voltage regulator(s) optional
2530—Clock/Clock Dist
2532—Display controller/Graphics Processing Unit/GPU for added processing
2534—Wi-Fi controller/General communication controller
2536—Wi-Fi antenna or general communication connector
2538—I/O connector for ex. antenna position feedback or Robotic antenna positioning control
2540—I/O interface chip serial bus (I2C, SPI, etc.) to I/O
2546—RF connector to external ant or RF input, direct conversion
2548—Bus to FPGA/CPU
2550—PCB card
2600—Assembly
2601—Mounting features
2602—Connector
2604—Ethernet Physical Controller OR Digital communication
2606—Antenna
2608—LNA
2610—Splitter
2612—Tuner
2614—ADC
2616—FPGA/CPU/LOGIC
2618—RAM
2620—EPROM
2622—LDOs
2630—Clock distribution chip
2632—Display controller/Graphics Processing Unit/GPU for added processing
2634—Wi-Fi or general communication chip
2636—Wi-Fi or general communication level translator PHY layer
2638—I/O pins for ex. antenna position feedback or Robotic antenna positioning control
2640—Watchdog timer
2646—ext. RF input signal
2648—Digital data bus
2650—PCB card
2700—PCB assembly
2702—Board connector
2704—PCB substrate
2706—RF Processor Module with Antenna
2708—Antenna
2710—RF Processor Chip
2712—Unintended RF Emission

DETAILED DESCRIPTION OF EXEMPLARY EMBODIMENTS

The following detailed description is merely exemplary in nature and is not intended to limit the described examples or the application and uses of the described examples. As used herein, the words "example", "exemplary" or "illustrative" mean "serving as an example, instance, or illustration." Any implementation described herein as "example", "exemplary" or "illustrative" is not necessarily to be construed as preferred or advantageous over other implementations. All of the implementations described below can be exemplary implementations provided to enable persons skilled in the art to make or use the embodiments of the disclosure and can be not intended to limit the scope of the disclosure, which is defined by the claims. It is also to be understood that the specific devices and processes illustrated in the attached drawings, and described in the following specification, can be simply examples of the inventive concepts defined in the appended claims.

The terms and words used in the following description and claims can be not limited to the bibliographical meanings, but, can be merely used by the inventor to enable a clear and consistent understanding of the invention. Accordingly, it should be apparent to those skilled in the art that the following description of exemplary embodiments of the invention can be provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a circuit board" includes reference to one or more of such circuit board.

It is to be understood that a device may be, but is not limited to an Integrated Circuit (IC) chip, FPGA, Application Specific Integrated Circuit (ASIC), board, partially assembled board, sub-system, complete computer system, computer peripheral or considered to be a pattern in computer memory. It is further to be understood that a good device can be a known good part, or can be a device containing known good software, firmware or hardware with significant RUL. Term "good" implies compliance with any one of manufacturer specification, industry standard, military standard, inspection protocol, quality control protocol, with significant RUL. Further, it is to be understood that a candidate device a device with unknown RUL.

Subject matter has been illustrated and described in a combination with an avionics unit, factory equipment, appliance, computer, computer peripheral, electronic device, such as an IC, electrical component, or a semiconductor, although it will be apparent to those with ordinary skill in the relevant art that the instant invention may be applied to other electrical or electronic devices such as boards, Physical Circuit Boards (PCBs), multi-chip modules, systems employing electronic device(s), sub-systems employing electronic device(s), single-board computers, electronic peripherals and the like and as such should not be interpreted as a limiting factor of the instant invention.

The forgoing description will be focused on emission(s) of electromagnetic energy and, more particularly, the emission(s) of electromagnetic energy being in a Radio Frequency (RF) spectrum, which is typically referred to in the art as frequencies above 3 kHz and below 300 GHZ, although infrared, infrasonic, and other emissions can be also contemplated by the exemplary embodiments. The forgoing description will be focused on unintended and unintended features of intended emission(s) of electromagnetic energy.

In this document, unintended emission(s) can be considered herein to be not only emissions emitted unintentionally by the device or system contrary to the intent and objective of the device, system, or its designers, but also unintended properties of intended emissions of the device or system. Unintended emissions refer to electromagnetic energy that is captured and analyzed which is not directly produced by the intended functionality of the device. Conversely, intended emissions refers to electromagnetic energy that is captured and analyzed by the apparatus which is a direct result of the intended functionality of the device, such as for example the carrier signal of an FM transmitter. Therefore, the intended digital data contained in an intended digital transmission would not be considered unintended, however other aspects of the intended signal such as harmonics, phase noise, frequency stability, out-of-band signal content, amplitude deviation, bit duration times, etc. could be deliberately used by the system for information content to be conveyed to the user.

Every electronic device gives off electromagnetic emissions when operating or when being simply in a powered state where the electric energy from an energy source is connected to various circuits and/or components within such electronic device. When the electronic device is simply powered on, the electromagnetic energy emanates from any one of wires, inter-component connections, and junctions within the electronic device. Exemplary embodiments operate by analyzing the unintended and/or intended emissions of the electronic device.

Emissions phenomenology, especially unintended emissions, is causally dependent on its internal circuitry, and manifests as well-defined signatures, in the time domain, frequency domain, or both, that can be classified by identifying characteristic signature parameters and metrics associated with altered or additional functionality. Here functionality is describes as the current working condition of the device, and can be referred to as operational, aged to a degree, likely to imminently fail, or beyond useful life. Operational here means that the device is in full specified working order, with no functional hardware flaws and fully functioning subcomponents. Altered or additional functionality refers to deviations from operational status that damage, degrade, or otherwise change the performance of the electronic device.

Signature element metrics that are analyzed may include, but not be limited to the type illustrated in FIGS. 18-21, frequency, wavelength, amplitude, phase, peak width, Full-Width-Half-Maximum (FWHM), harmonic indices, harmonic spacing and peak position, peak skewness, cross modulation peak characteristics, and magnitude of the noise floor, and power differences between peaks.

This approach can bear several potential advantages, namely passive, non-contact scan of the electronic device, for example being under test, completely non-destructive and poses no hazard to operators or environment. The example electronic devices under test also can be tested while integrated into their operational environment. Such rapid test approach may enable continuous screening of electronics during operations, preventing any possible failure and potential unexpected loss of operation, it can continuously monitor and test the electronic device and even monitor a system employing such electronic device while it is usefully and functionally operating, without interfering in any way with the normal operation. This approach can virtually immediately detect equipment change or failure status in any one of the following conditions: while it is being used, is fully operational, and/or before it can cause malfunction, loss or damage. Supervisory systems, circuitry and/or separate software designed for this purpose, upon detection, can be notified of a new, attempted, ongoing or sudden failure or partial degradation and thus allow corrective action to be taken that may include any one of a switchover to an isolated redundant backup system, disconnection of device, placing the electronic device and/or its system in a non-operational state to prevent damage of other equipment or other loss, notifying personnel, quarantine of the electronic device and/or its system to prevent incorrect communications, control or actuation, disabling external access to the electronic device and/or system to prevent unwanted external access to an Electronic system, and/or other appropriate, necessary or desirable actions. A signal, voltage state value, watchdog periodic signal, or the like can be transmitted to notify external equipment or personnel of the continuous, periodic, sporadic or occasional monitored equipment status. Further, an external RF transmission can be transmitted, either manually or automatically, to electronic device and/or its system to disrupt, disable or change state of the device such as from automatic to manual operation. It can be employed in Process Control manufacturing electronics instruments, nuclear plant electronics, and server racks, to name a few.

It should be noted that the emission acquisition means can be an external antenna integrated into a card unit, and/or a external RF emission acquisition means integrated into a separate card unit and comprising the invention that may be of many antenna types including near field, far field, free field, narrow band, or wideband antenna type, wherein emission features or emissions especially in the RF range coupled into the devices' normal signal line circuitry may be similarly acquired through appropriate capacitive, inductive or direct coupling means to I/O lines of the electronic device without interfering in any way with normal operation.

In one exemplary embodiment, discernment of a failed condition between an unknown condition device and a known new and good device with and without active use can be based solely on unintended emission signatures and identified characteristic signature elements associated with different categories of part, boards, subsystems, or components and algorithmic method for detecting Electronic failure in emission signatures for a relevant device, is presented.

Subject matter provides a description for automatically detecting and classifying failure or imminent failure in Electronic equipment through unintended emissions. Characteristic emission signature elements associated with different equipment can be identified using at least an algorithmic methodology for detecting these elements. Algorithms targeting aging or degradation phenomenology can be embedded within the electronic assessment sensing technologies for the purpose of an exemplar embodiment though other embodiments can be clearly possible. Automated detection of aging or degradation in Electronic assemblies and devices based on unintended emission phenomenology is an exemplar embodiment. Automated alarming, switchover to a redundant system, or corrective measures can be readily integrated with degradation detection capabilities for full automation of the technology, reducing operating expenses by minimizing labor hours needed to perform screening and has been clearly envisioned and contemplated here within. The capabilities disclosed herein have a broad impact across domestic industries in ensuring continued operation of safety-critical equipment and technology and their operations by enabling rapid detection of hardware failure onset or degradation and for technology users to be able to validate the technology operation that is used on a day to day basis.

All aspects of a circuit, for example such as integrated circuit (IC) affect the waveform emitted as power percolates through active and inactive sections of the IC. The resulting emission spectrum serves as a fingerprint that can be used for determining degradation, aging, degraded or inoperable parts, boards, components, connectors or subsystems diagnosis and/or identification for rapid troubleshooting of degraded or inoperable parts, boards, components, connectors or subsystems, total operation time and Remaining Useful Life diagnostics. Of degraded or inoperable parts, boards, components, connectors or subsystems manifest in the measured emission spectrum. This phenomenology may also be used simultaneously to screen software, firmware or hardware components of systems differentiating proper operation from malware infested components/boards/sub-systems/systems, containing counterfeit and/or recycled components, recycled boards, sporadically faulty hardware, and/or intermittently operational Electronic equipment in a rapid test typically requiring approximately 3 seconds per system on average. The algorithmic approach, executed by control device(s), for example such as a microprocessor-based controller, leverages this phenomenology to determine whether unacceptable operational anomalies can be present in the Electronic device or if similar operational defects or operational problems can be present.

In one exemplary embodiment, therein is provided a novel means for rapidly and reliably detecting Electronic equipment defects which can be typically in single IC component, board, module, sub-system or system and their detection will invoke appropriate corrective measures. Location of defect is also encompassed in some embodiments of this invention.

Analysis of unplanned emission artifacts may provide an indirect and potentially non-contact method for examining the inner workings of an IC without the need for destructive or costly full electrical test techniques. Changes to the internal circuitry of the IC affect current flow when IC is powered and thereby alter the emitted waveform from the IC. This phenomenological relationship can be used to detect these changes and identify whether a received unplanned emission artifacts is clean or whether problematic circuitry exists.

Detection can be achieved by supplying power, to a device, subsystem or system under test, capturing the resulting unplanned emission artifacts, and algorithmically analyzing by control device(s), for example such as a microprocessor-based controller, the emission spectrum so as to identify characteristic signature elements of such spectrum. Alternatively, capturing of the emissions of a self-contained system can be done in-situ, already powered and operational, near-field or far-field. During operation, the electronic component, system or sub-system can typically monitor device emissions at typically <−80 dB with a sensitivity greater than −150 dBm desirable and example embodiments providing sensitivity of −160 dBm, −170 dBm, and −172 dBm for a greater sensitivity to more numerous and smaller emissions features such a lower dB level cross modulation products. Some embodiments of the device may incorporate a electromagnetic shield, typically of an electrically conductive material, which further may be movable and/or replaceable, said shield typically open or adaptable to substantially attenuate emissions and shield or reject RF emissions and/or RF noise from other electronics devices not being examined at that time or from general environmental noise.

The unanticipated RF emission artifacts phenomenology used has a thoroughly established foundation in electrodynamics. Current flow through internal circuitry, specifically changes in electron current in conductors produce radiated emissions that can be dependent upon path length, geometry, and the electrical properties of the circuitry used (trace resistivity, dopant levels, etc.). Software algorithms and/or executable instructions perform an algorithmic analysis on emission signatures to automatically, without user intervention, identify acquired key signature elements which then can be analyzed or automatically compared to assess state and/or condition of the internal circuitry of the device being tested.

Emission signature elements characteristic of operationally aged altered electronic devices and signature content that manifests due to the presence of RF frequency (typically in Mhz real numbers) vs. RF signal strength (typically in relative dB or absolute dBm) and optionally also in phase (typically in degrees or radians) and also optionally also relative to other emissions or emission harmonics patterns can be acquired and analyzed. Algorithms and/or instructions can be executed by one or more processors to extract signature elements in locations that can be specifically associated with Electronic And Especially Avionics degradation or key Electronic And Especially Avionics electronics processing operations such as transmitter signal amplification or pitot tube sensor front-end signal conditioning, flagging the Electronic And Especially Avionics degradation as unacceptable and/or identifying the degradation, anomaly, degree of degradation, and/or degree of anomaly present. The scoring of the degree of degradation, and/or degree of anomaly present may be in time period of average RUL, standard deviations from normal operation, percentile of degradation in devices considered substantially functional, or other numerically categorized or classified means. The device can then be manually or automatically quarantined prior to disposal, repair or replacement.

The sensitive unintended electromagnetic energy collection apparatus could be any means known in the art for collecting electromagnetic energy.

In one embodiment, a highly sensitive RF energy collection apparatus, including at least a receiver coupled to an antenna, and a signature measurement comparison means, for example such as a micro-processor based controller, is used for collecting emitted electromagnetic energy and processing and comparing signature of the collected electromagnetic energy to a known standard and where RF is defined as covering the frequency range from about 16 KHz to about 300 GHz.

The described techniques can be applied, in addition to the RF emissions, to higher frequency or shorter wavelength emissions, for example such as infrared spectrum analysis. In one example, some electronics may unduly draw excess current causing excess heat to be radiated from that portion of a circuit or chip. This energy can be captured, measured and analyzed.

Radiated emissions, may be targeted in a non-contact, non-destructive, and fast enough manner enabling the inspection of all material (100% screening) intended for critical applications. These emissions can be analyzed to conceptually provide a fingerprint or fingerprints of what is anticipated and hence form a pattern or patterns. These patterns can be tracked, monitored and verified to be certain to a degree of probability or alternatively a quantified score that the hardware is functioning properly and/or has not substantially aged, degraded, and has sufficient RUL.

The subject matter may often differ from conventional approaches by way of allowing rapid placement, removal, or upgrade in an existing card rack or equipment rack such as a 19" rackmount enclosure. The subject matter may also often differ from conventional approaches by way of typically acquiring power from the card edge connector and the power offered by the existing power supply in the equipment rack.

The energized device that is being tested, inspected and/or interrogated directly or indirectly may provide a mechanism for transmission of the energy that is being radiated which is governed by the internal design of the device being inspected. Typically, the source that powers the device is the energy which powers the electronics though as noted it can be an oscillating signal such as a clock, clock signal, signal, frequency input, frequency reference, signal generator, frequency generator or other oscillating sources that can be known in the art. A mechanism that transfers the energy to a radiating element within the device being tested, inspected and/or interrogated can be integrated circuit dies, wire bonds, semiconductor traces, board traces, wires, cables or structural capacitive or inductive coupling. The radiating element may be an intendedly radiating antenna or an unintended antenna that due to physical dimensions acts as a reasonable antenna. As the internal parts of the monitored electronic devices whether it be a discrete semiconductor, integrated circuit, printed circuit board, circuit board assembly, system, sub-system or product operate, they emit a different electromagnetic signature when in a different operational state, and operational states can be differentiated based on emissions analysis for inspection or screening purposes. Operational states may include or be influenced by malfunction of one or more devices, software version being executed, improper software execution, radiation damage, memory values change, mechanical contact loss due to mechanical shock or vibration, and the like.

One exemplary embodiment can screen, detect, and disqualify Electronic equipment replacement boards, modules or components containing excessively aged regions, ICs, boards, modules or chips to protect the reliability of critical systems which rely on complex ICs. These potentially over-aged, faulty, degraded, inoperable, marginally operable devices include FPGAs, Complex Programmable Logic Devices (CPLDs), microprocessors, microcontrollers, Digital Signal Processing (DSP) chips, Power PCs, System on a Chip (SoC) architectures, etc. Automated algorithmic assessment and signature comparisons of unintended emissions from these devices as well as fully integrated boards, systems or computer assets that contain these components may be carried out in the invention described herein. Comparisons with previously or simultaneously acquired known good emissions from known good software, firmware or devices operating in known good hardware can be typically employed. Simultaneous or substantially simultaneous comparisons can be acquired by the use of two or multiple invention devices in communication with each other, simultaneously comparing RF emissions acquired from boards and exchanging results of acquired emissions with each other. In this case, typically one of the boards would be a known good device.

Automated, i.e. without user actions during test execution, detection of Electronic equipment anomalies in Electronic devices based on unintended emission phenomenology is another exemplar embodiment. The device may be robotically manipulated, located, and/or oriented for maximum emission signal strength reception, and/or positioned to take measurements, requiring little or no user intervention or operation.

Automated periodic retesting can readily be integrated with the detection capabilities for full automation of the technology, reducing operating expenses by minimizing labor hours needed to perform screening manually and has been clearly envisioned and contemplated here within. The developed capabilities may have a broad impact across domestic industries in reducing unnecessary replacement costs and their operations impact by enabling rapid detection of degradation threshold onset and be able to validate the technology that is used on a day to day basis. A robotically manipulated device, moved, placed on or near rackmount Electronic Systems or chassis mounted PCB cards to be tested may automatically acquire RULs of these Electronic Systems is also contemplated herein.

Similarly, a consistent difference in acquired spectrum at the same frequency, span and RBW between a good device and an unknown device, and/or that is a change in amplitude from new devices to a degraded device or an operational device to an inoperational device, may lend evidence of functional degradation or disablement in an unknown FUNCTIONING device. This same principle may apply to any spectral regions illustrating evident differences, such as those shown in FIGS. 20 and 21, including frequency, wavelength, amplitude, phase, peak width, Full-Width-Half-Maximum (FWHM), harmonic indices, harmonic spacing and peak position.

It can be further recognized that continuously and/or commonly appearing peaks or characteristic features evident in the frequency domain can be acquired and subtracted out as a preprocessing step to further enhance and better reduce the influence of constant unrelated signals when creating or comparing signatures. Additionally, the use of non-coherent integration can reduce the unwanted noise present and enhance the features' characteristics and pattern resolution. The employed hardware components can provide sufficient speed of data collection processing and throughput to extract significant information from the Electronic computer asset or Electronic device under test, to be tested. For example, emissions from an adjacent computer on an adjacent card can be exploited for detection of degradation, malfunction or aging.

There can be typically at least several exemplary modes of operation. In the signature acquisition mode, the characteristics of frequency regions containing emission signature features/elements specific indicating expected or proper operation or level of degradation in a system or a device may be found and acquired by both the antenna and the receiver coupled to the antenna. Alternatively, in the same basic signature acquisition mode, the signature characteristics of frequency regions apparently containing features specific to a known new device operating in a system or a device may be found and acquired. The signature acquisition mode can search for and find all candidate signature regions which exhibit a characteristic group of complex peak structures. These candidate signature regions can later be compared, by software and/or executable instructions, with candidate signature regions emitted from known new or known degraded devices. The comparison yields signature regions which can be common to both and also those of the same frequency which indicate no common relevant emissions to be compared, such as an arbitrary noise generator device in some frequency regions, and also signature regions which can be present, absent, or modified in only the exemplary devices and indicative of a basis for comparison and discriminating factor which can be used to weigh, compare, evaluate, or identify Electronic hardware from its RF emissions.

Alternatively, the signature acquisition mode can include a means such as an external means to deliberately age or disable a known specific exemplary configuration into the device, chip, or board under test to acquire the exemplary degraded signature while the device is running or in a failure condition. Additionally, additional stresses may be placed on the device being tested, degraded or aged such as higher or lower than normal temperature, power spikes, temperature gradient, electrical noise, electrical signal, humidity, pressure, voltage input, vibration, G forces, nuclear radiation, or similar stresses. In one exemplary embodiment, there may be a means to exercise the board under test using driven controlled outputs such as outputted interrupts for use as device or board's inputs to invoke a state which triggers or better invokes exhibits or exercises the states characteristics to be examined. The degradation characteristics may only exhibit highly recognizable signature behavior patterns periodically, sporadically, occasionally, conditionally and therefore a means to trigger such behavior, such as deliberately causing a state in the system or device, or performing an action other I/O operation, or operation mode selection may be contemplated here within.

The signature comparison mode may search for and obtain signature frequency regions from an antenna located in virtually unlimited possible number of antenna configurations and compares the signatures acquired with the characteristics of known good or bad operational states or software implementations running in the hardware under test. The antenna configuration, orientation, polarization, location, gain, or other characteristics may be measured, established and/or manipulated to acquire emission characteristics of devices under test under these differing antenna configurations. An example would be rotating the antenna 5 degrees along an axis and moving it in one spatial direction 10 mm and obtaining a new set of data to be analyzed or converted into a signature for that new specific location—to be later compared with signatures obtained from other electronic devices with acquisition antenna similarly or identically configured.

Though one embodiment focuses on emissions from about 16 KHz to about 300 GHZ, the bandwidth can be reduced to about 30 MHz to about 1 GHz to capture the majority of emissions. Characterization of Electronic equipment, in one embodiment, may be performed over the 3 kHz-300 GHz frequency range/spectrum, in any of the increments, with high spectral resolution (low resolution bandwidth (RBW)) to maximize Signal-to-Noise Ratio (SNR). Other embodiments may allow measurements from 1 GHz to 10 GHz, 10 GHz to 100 GHz, 100 GHz to 300 GHZ, 1 kHz to 1 MHz or the complete range from 16 KHz through 300 GHz most of which is often defined as the Radio Frequency (RF) band. Data acquisition can be controlled via the software or executable instructions, enabling full capture of broadband signal information in a reasonable time frame. Specific regions of interest as candidate signature regions identified in broadband sweeps of the frequency range/spectrum, can be closely examined using software algorithms for the presence of peaks and especially peaks indicating intermodulation components. Real-time assessment enables capture of multiple looks to identify any variability in signature due to random noise fluctuations and is critical in capturing time-varying content within signatures.

Emission signatures within the any increment of the frequency range/spectrum can be analyzed to identify signature elements characteristic to Electronic equipment categories such as computational devices as typically indicated by one means as an increase or decrease in noise floor emitted or in phase noise of emitted peaks. Signatures for unaltered or known Electronic equipment boards may provide a baseline to expedite comparison with known aged, faulty or degraded boards and identification of aged, faulty or degradation signature characteristics.

The presence of the anomaly manifests in the emission signature in at least one of alteration of signature elements when compared with an associated exemplary Electronic board, inclusion of additional signature elements and removal of signature elements seen in the baseline. Examined emission signature elements may include, but not being limited to, spontaneous emission phenomenology, non-linear mixing products, phase noise, signal to noise ratio, and noise level.

The particular embodiments are directed to a non-destructive assessment of the internal circuitry of electronics operating on cards in chassis or racks is achieved through analysis of their unintended radiated emissions (or unintentional aspects of intentional emissions such as normally acceptable deviations in phase noise within an RF transmission), providing sensitivity to minute alterations to the functionality and operability of cards, components or sub-components inside these digital electronics infrastructure environments. These alterations can be induced by power surges, radiation exposure, or sudden failure the device can incur at any time, whereby the device deviates from normal functionality.

The particular embodiments are directed to an apparatus, system and method for screening and inspecting electronics for performance changes in electrical and electronic based components, boards, devices, and systems.

In some embodiments, the apparatus can includes a quickly emplaced, highly configurable sensitive unintended electromagnetic energy collection device or sensor, a controller with one or more processors processing algorithms or executable instructions to compare signatures of the collected energy from the device(s) under test to a known standard, standard of comparison, or to a predetermined understanding of expected emissions of the inspected object and at least one specifically created algorithm or executable instructions for automatically determining if the signature of the collected electromagnetic energy matches the standard, which may define presence of devices showing characteristics of failure.

The particular embodiments are directed to replaceable antenna modules and means and/or method(s) for detachably positioning replaceable antenna modules in a preselected zone on the antenna card substrate.

Now in reference to FIG. 1 therein is illustrated an exemplary antenna card, generally designated as 100. The antenna card 100 of FIG. 1 comprises an antenna module 130. The antenna module 130 comprises an antenna 102 configured to capture emissions of electromagnetic energy in a radio frequency (RF) range. The antenna 102 is being illustrated in FIG. 1 as a fractal antenna. The antenna module 130 also comprises an antenna substrate 114 that the antenna 102 is being mounted on. The antenna module 130 also comprises an antenna connection member 106. Such antenna connection member 106 can be a coaxial RF connector. The antenna card 100 further comprises a card substrate 118. The antenna card 100 also comprises the means for detachably positioning the antenna module 130 in a preselected zone on the card substrate 118. In an example, the means comprises an orthogonal array of first features through a thickness of the card substrate and wherein the antenna substrate comprises two or more second features, the two or more second features configured to mate with any two first feature within the orthogonal array of first features during use of the antenna card. More specifically, in this example, the first feature can be an aperture 116 and the second feature is a pin 104 on an antenna substrate 114, although locations of apertures 116 and pins 104 can be reversed.

The antenna connection member 106 is employed during use of the antenna card 100 to communicate a signal representing the captured RF emissions by the antenna 102. However, the antenna card 100 can comprise an interface connection member 112 on the card substrate 118 and a connection 110 between the antenna connection member 106 and the interface connection member 112. The interface connection member 112 can be another coaxial RF connector with the connection 110 then being a coaxial RF cable equipped with mating connectors. Then, the signal representing the captured RF emissions by the antenna 102 will be available at the interface connection member 112. The RF connector can be of a sub-miniature A (SMA) type.

The antenna card 100 can be configured for insertion into a card slot within a chassis or a racks, for example as illustrated in FIG. 5, 6, 10, or 13. In this configuration, the antenna card 100 comprises a backplane connector 120 mounted on the card substrate 118. The backplane connector 120 is configured or operates to at least physically secure the card substrate 118 within a chassis slot to reposition it correctly and prevent movement once inserted. In some embodiments it also provides power and/or unintended emissions.

The antenna card 100 can also comprise one or more RF processing elements. The RF processing element is being shown in FIG. 1 of a band pass filter type 190 and being mounted on the card substrate 118. The band pass filter type 190 is configured or operates to eliminate strong unwanted RF noise at other frequencies not of interest. FIGS. 1A-1D illustrate different examples or forms of the antenna module and RF processing element. In FIG. 1A, the antenna module 130 comprises the fractal antenna 102 and is being further illustrated as comprising the RF processing element an antenna matcher 188. The antenna matcher 188 is configured or operates to achieve better impedance matching. In FIG. 1B, the antenna module 140 comprises a loop antenna 142. In FIG. 1C, the antenna module 150 comprises a dipole antenna 152 and is being further illustrated as comprising the RF processing element being a low noise amplifier (LNA) 164 connected to the LNA power connection 168. In FIG. 1D, the antenna module 160 comprises an inverted-F antenna (PIFA) 162.

Thus, in an embodiment, the antenna can comprise any one of a loop antenna, a fractal antenna, a dipole antenna, a PIFA antenna, an irregular antenna, and an antenna array. In either form, the antenna module is configured for a repeatable placement/registration into a specific zone on the card substrate 118 for a repeatable measurements of electronic devices operating on different cards within the chassis or rack and being position next to the antenna module. Such zone can be the same zone during use of antenna module. Such electronic devices can be also referred to as device under test (DUT).

Further, the RF processing element can be mounted on the antenna substrate 114, can be mounted on the card substrate 118, can be connected to the antenna module 130 or can be even connected to the antenna card 100. The RF processing element can comprise any one of a bandpass filter, a low noise amplifier (LNA), a highpass filter, a lowpass filter, a surge suppressor, an impedance matcher, and a splitter/combiner.

The RF processing element operates to enhance a content of the captured RF emissions (received signal), by, for example, rejecting unneeded noise at nearby frequencies.

It is also contemplated that a registration mechanism that includes a linear encoder that can be used to measure the relative X,Y,Z distance, which ensures that the measurement can be repeated from the same location relative to the DUT.

The antenna card 100 can be also referred to as a sensor configured in a PCB card form factor and operable to acquire emission of electromagnetic energy in RF spectrum from electrically powered devices or electrical devices, and aged, degraded or non-functional versions of the same electrical devices.

Figure 2:
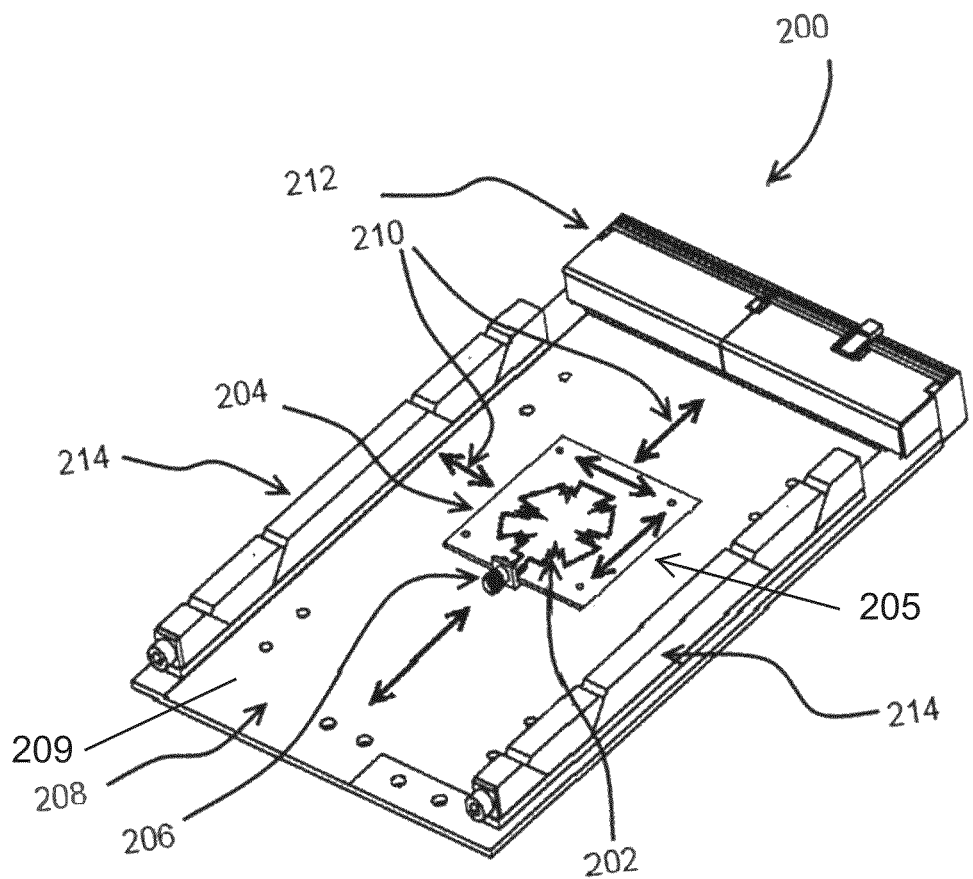
FIG. 2 illustrates an exemplary embodiment of an antenna card.

FIG. 2 illustrates an exemplary antenna card 200 with an antenna module comprising a fractal antenna 202 and the RF connector 206 on the antenna substrate 204. The antenna module of FIG. 2 is illustrated as being constructed generally identical to the antenna module of FIG. 1, although the antenna modules of FIGS. 1A-1D are being contemplated herewithin. The antenna card 200 also is shown with the backplane 212 and conduction cooled contact rails 214 on two edges of the card substrate 108 but that can be also provided on more or less edges. The means for detachably positioning the antenna module of FIG. 2 in a preselected zone on the card substrate 208 comprises a first member 205 on the antenna substrate 204 and a complimentary second member 209 on the card substrate 208. Each of such first member 205 and the second member 209 can be adhesive, ferrite material, magnet or hook and loop fastener. The RF connector 112 and/or the RF processing element of FIG. 1 can be also provided herewithin. Axis of motion of the antenna module are references by numeral 210. The conduction cooled contact rail 214 in this embodiment is configured or operates to secure the card physically to the chassis and conduct heat away from the card.

Figure 3:
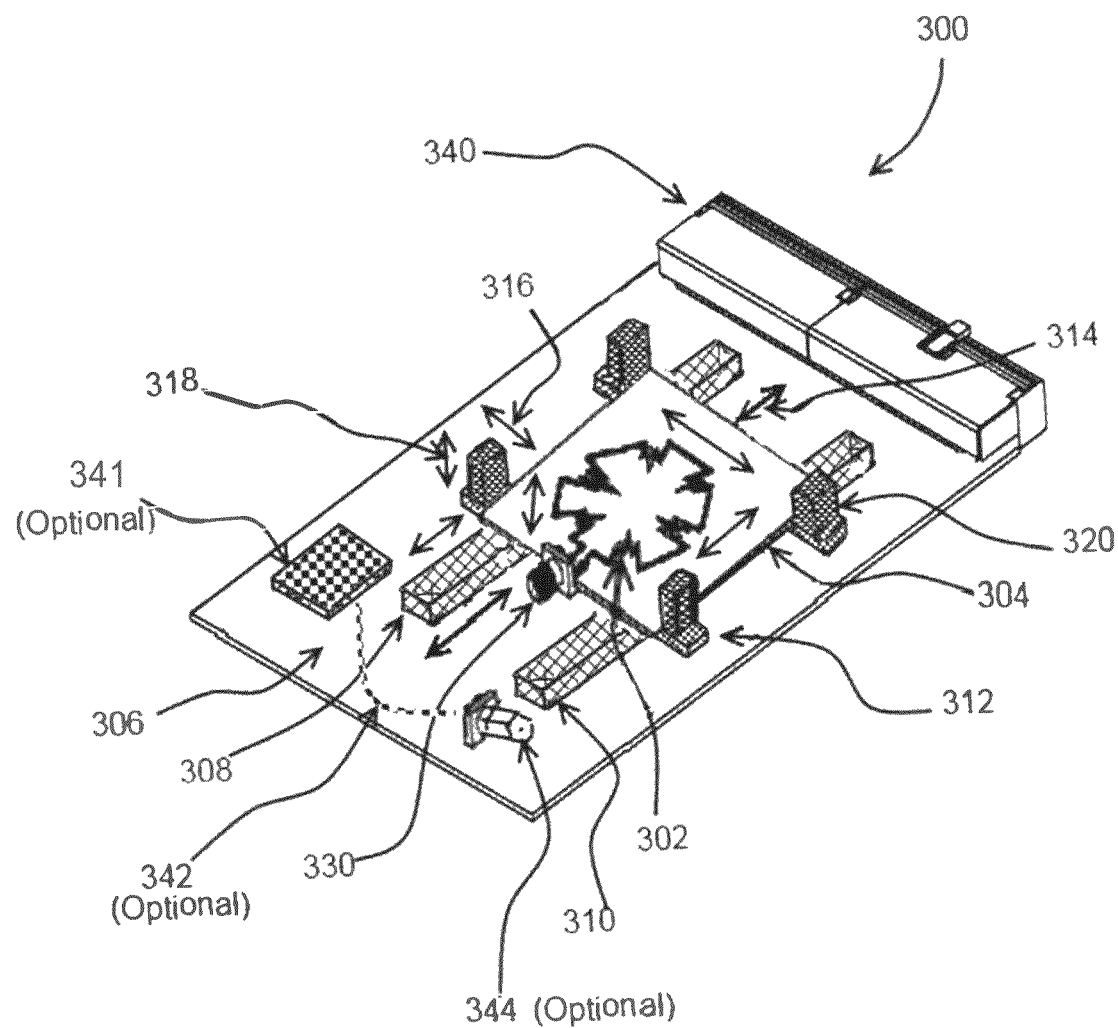
FIG. 3 illustrates an exemplary embodiment of an antenna card.

FIG. 3 illustrates an exemplary antenna card 300 comprising an antenna module 304 with a fractal antenna 302 and the RF connector 330 on the antenna substrate. The antenna module of FIG. 3 is illustrated as being constructed generally identical to the antenna module of FIG. 1, although the antenna modules of FIGS. 1A-1D are being contemplated herewithin. The antenna card 300 also is shown with the backplane 340.

The means for detachably positioning the antenna module of FIG. 3 in a preselected zone on the card substrate 306 comprises X, Y, and Z axis linear positioners/controllers, 308, 310, 312, and 320, respectively. The respective directions of motions are referenced with numerals 314, 316, and 318. In other words, the antenna 302 can be precisely repositionable along the X, Y, and or Z axis. The antenna card 300 can include includes a linear encoder in or in place of X,Y,Z positioners 310, 312, 320 that is utilized for measuring or registering the antenna 302 location relative to the antenna card 300.

Although a movement of the antenna module in three linear directions is illustrated, a movement in only one direction is also contemplated herewithin by providing only one linear positioner/controller.

Optional 341, 342 and 344 can be provided to process the RF signal, Bandpass, high pass or low pass filter it, and/or act as a RF signal logger or audible alarm.

Figure 4:
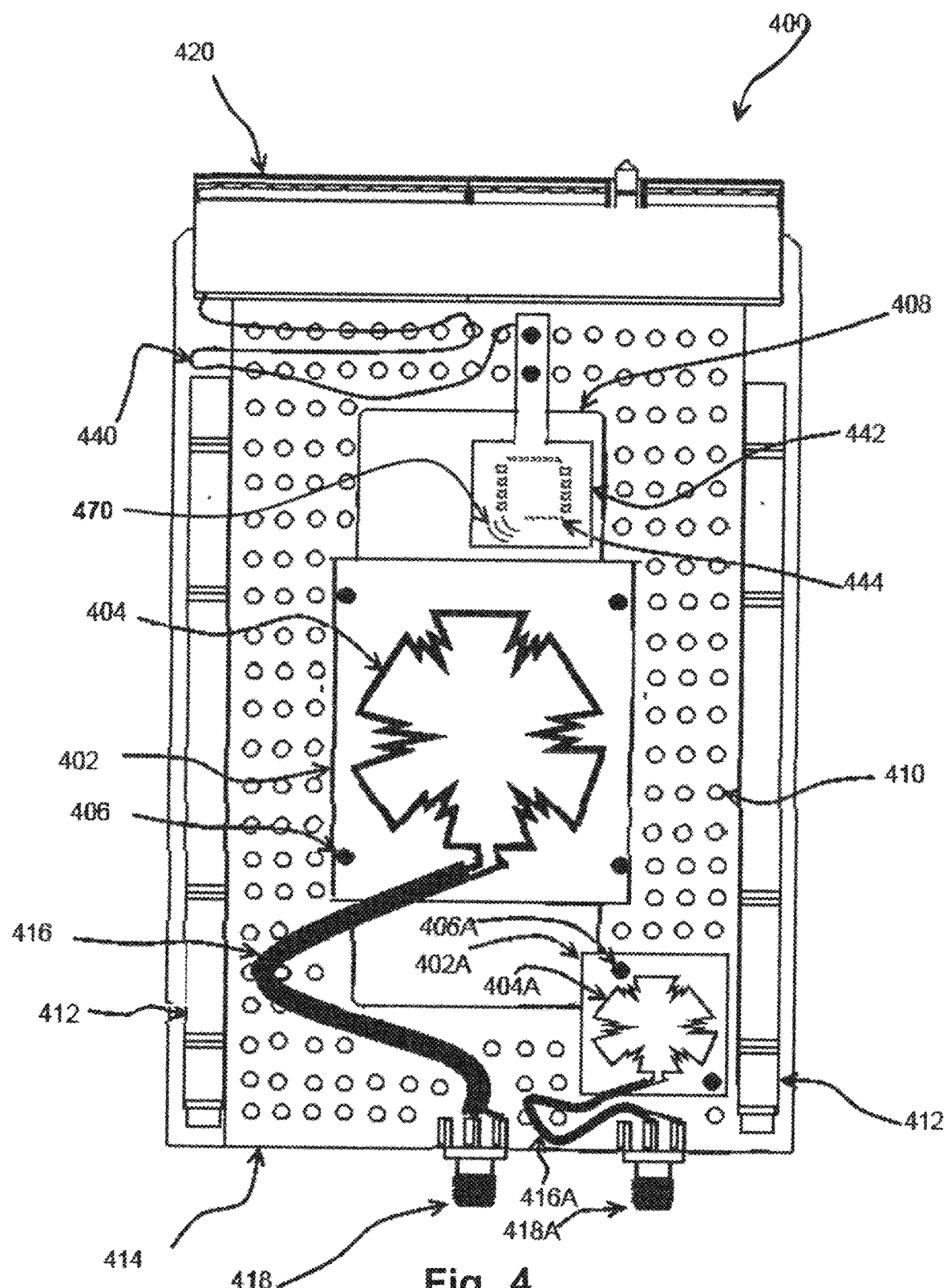
FIG. 4 illustrates an exemplary embodiment of an antenna card.

FIG. 4 illustrates an antenna card 400 comprising two removable, replaceable, movable antennas modules 402 and 402A, and their respective antenna module, are shown. Antenna 404 is shown as being of a larger size and can be referred to as a first antenna. The antenna 404 can be directly coupled to the RF connector 418 by way of the coaxial cable 416. Antenna 404A is shown as being of a smaller size and can be referred to as a second antenna. The smaller antenna 404A serves to receive RF at higher frequencies or to couple to a specific different semiconductor device collocated nearby, underneath or above the antenna. The antenna 404A can be directly coupled to the RF connector 418A by way of the coaxial cable 416A. Each of the antenna modules 402 and 402A can be adapted with the location/registration features 406, 406A. The antenna card 400 can comprise a cutout region 408 that may be used for reception of emissions from below the antenna card 400. The cutout region 408 may be an actual void or a region where no conductor is present, for example such as ground plane conductor. Alternatively, a ground plane may be present throughout or in selected regions of antenna card 414 to act as RF shield of emissions from below. A semiconductor device 444 can be positioned within cutout region 408. A replaceable, removable, movable shield 442 attached to a ground wire 440 may be used for the purpose of partially shielding the unwanted, unneeded emissions 470 from a different unexamined semiconductor device 444 underneath it from antenna 404 if it is interfering. Conduction cooling rails 412 are shown as options on some antenna cards to secure the card to the chassis and improve cooling of optional components, for example such as LNAs 786. The semiconductor device 444 being a DUT semiconductor device 444 emitting unwanted interfering emissions 470 seen under RF shield 442 and connected to ground wire 440 is attenuated by RF shield 442 which desirably reduces pickup in antenna 404.

Figure 5:
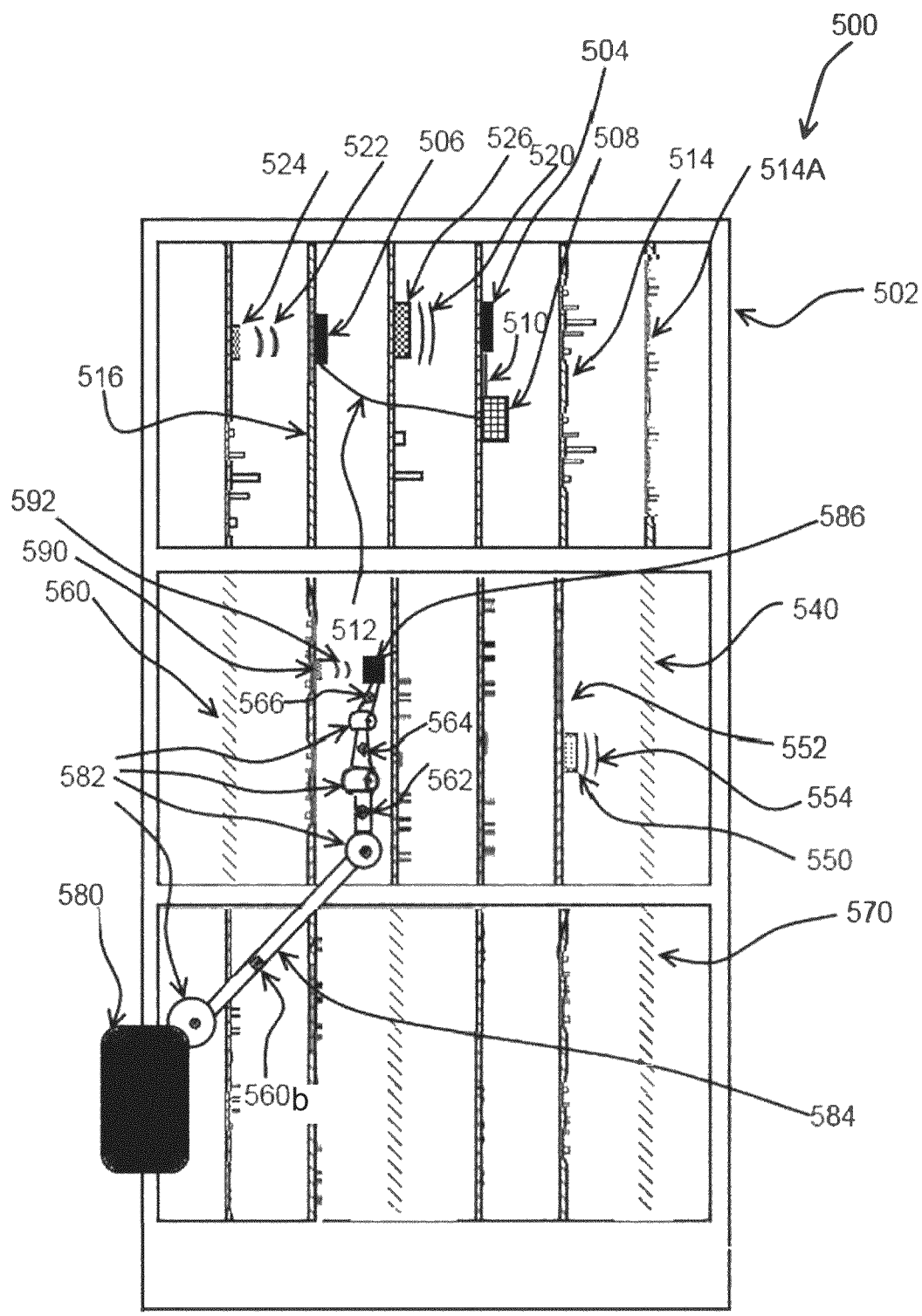
FIG. 5 illustrates an exemplary embodiment of an equipment chassis rack containing circuit board cards, which can also include antenna cards of FIGS. 1-4.

FIG. 5 illustrates a PCB card rack or chassis assembly 500. Such rack or chassis assembly 500 can be used to control operation or a function or a plurality of functions. For example, the rack or chassis assembly 500 can be installed on an aircraft, ship, train, bus, automobile or the like. The cabinet, rack or chassis assembly 500 comprises a cabinet or an enclosure 502 with printed circuit board (PCB) assemblies, for example such as referenced with numerals 514, 514A, and 552 mounted in conventional slots. The cabinet or an enclosure 502 can be of an open, partially open or closed type. It would be understood that such cards contain components, for example such as semiconductor device 524 that emits electromagnetic energy 522 and/or semiconductor device 526 that emits electromagnetic energy 520, and/or semiconductor device 550 that emits electromagnetic energy 554, and/or semiconductor device 590 that emits electromagnetic energy 592. Some slots, shown as 540, 560, 570 can be empty slots without cards. The rack or chassis assembly 500 is also illustrated as comprising one or more antenna cards 516 with an antenna module 504 and/or 506. The antenna modules and/or monitoring cards can be of the type as disclosed in FIGS. 1-4. The monitoring antenna cards can be placed or relocated to empty slots to monitor other components at other locations as needed or as desired or additional antenna cards can be used in empty slots.

FIG. 5 illustrates the rack or chassis assembly 500 containing cards which are or can be monitored by the replaceable/movable/removable/upgradeable emissions diagnostic unit 508 or its optionally attachable antennas 506 mounted on a removable card and communicating using coaxial cable 512. The diagnostic unit 508 can be connected with a cable 510 to the antenna module 504 mounted on the same antenna card.

The rack or chassis assembly 500 can also comprise a robotic emission processing means 580 for inspecting PCBs, for example such as a PCB 552 or electronic devices thereon either in addition to or as an alternative to the antenna cards. The arm(s) 584 move using motorized axes 582 and position feedback sensor 560b. Additional accelerometer or position sensors 562, 564 and 566 can be used. Robotic emission processing means 580 may dwell over a single board or component, or periodically, occasionally, continuously, or sporadically move to different boards or components. In other words, FIG. 5 further illustrates an attachable robotic unit 580 that is configured to precisely position an antenna 586 to one or multiple locations permanently, successively, or repeatedly to acquire and process intended or unintended emissions 592 at those locations from typically nearby electronic components or semiconductor devices, for example such as a semiconductor device 590.

Figure 6:
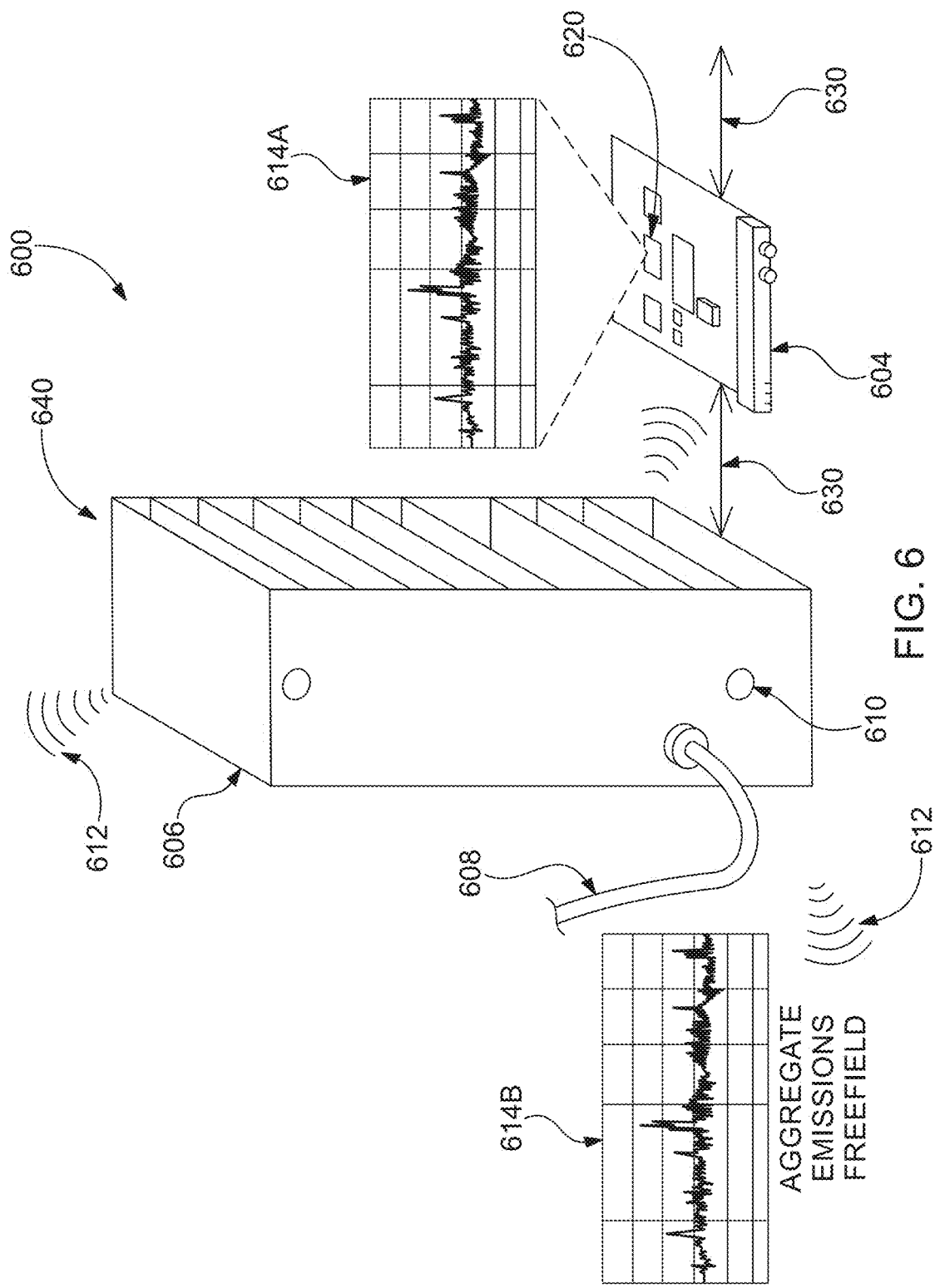
FIG. 6 illustrates an exemplary embodiment of an equipment chassis rack containing circuit board cards, which can also include antenna cards of FIGS. 1-4.

FIG. 6 illustrates an apparatus 600 that comprises PCB card chassis assembly 640 comprising chassis 606 with PCB cards and with emission processing means or sensor card 604 for inspecting PCB cards above it or below it or electronic devices thereon. Emissions 612 represent RF escaping from the PCB card chassis 600 which may be monitored from a means such as emission processing means 580 external to it. Emissions status or spectrum may be communicated to the outside world by cable 608 to indicate need to do a failover switch upon detection of a failure status. One of the cards, for example such as the card 604 can be an antenna card in accordance with embodiment of FIGS. 1-4. The antenna 620 on such antenna card 604 can be configured to receive free-field, near-field and/or far-field emissions. 614A represents a spectrum of emissions received by the antenna 620 and 614B represents a spectrum of emissions received by the antenna sent over cable 608. Arrow 630 indicates one example of a removal/insertion directions of the cards.

Figure 7:
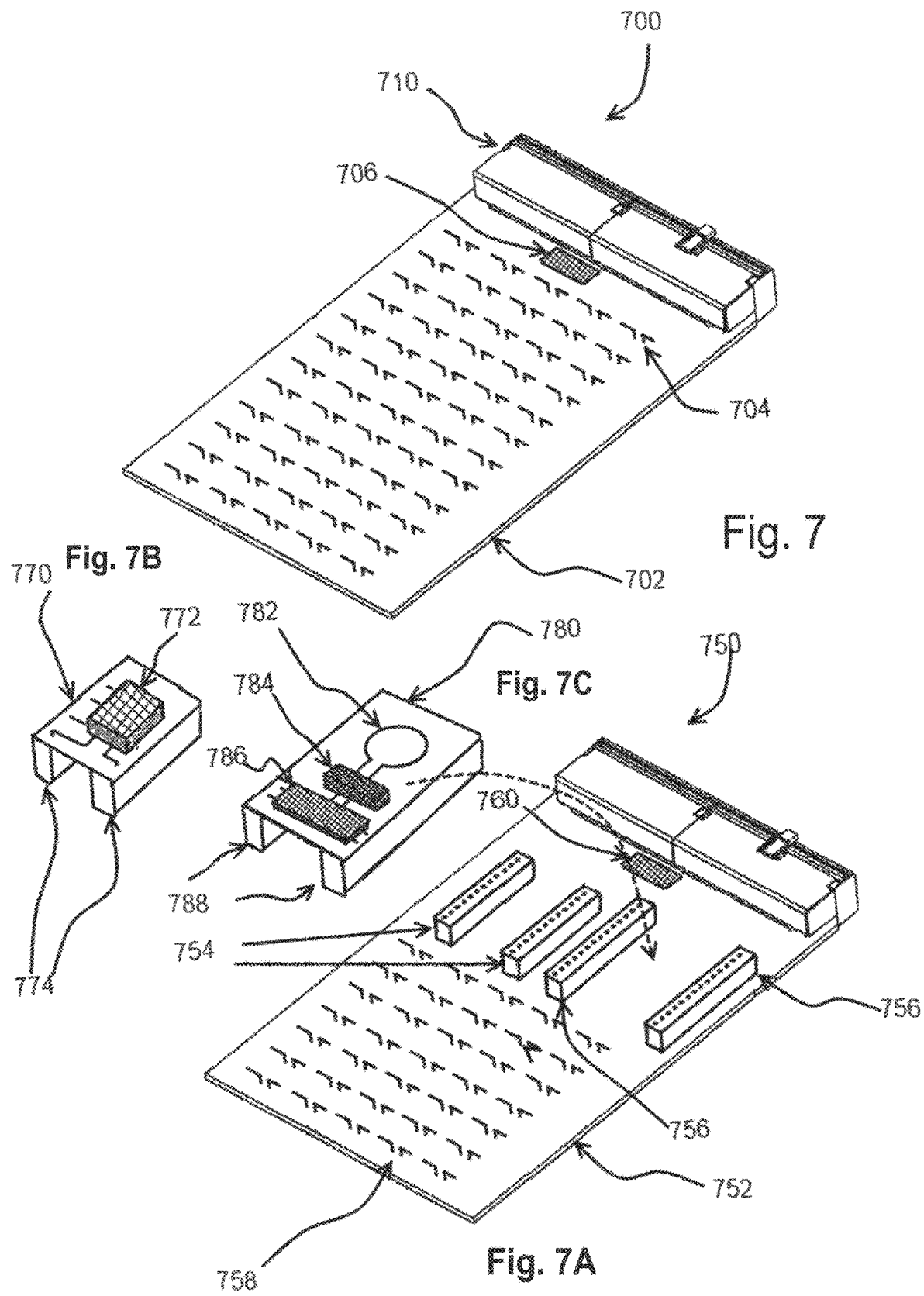

FIG. 7 illustrates an exemplary PCB assembly 700. The PCB assembly 700 comprises a PCB 702. A dipole antenna 704 is mounted on PCB 702. A steerable antenna controller and RF emissions diagnosis module 706, which also may house an emissions processing logic unit, is also mounted on the PCB 702. The module 706 can be mounted next to the backplane connector 710 that is employed for connecting the PCB assembly 700 within a chassis of PCB assemblies. The PCB assembly 700 determines results of emissions analysis and sends the results through communication out the backplane connector 710.

FIGS. 7A-7C illustrate an alternative configuration of the PCB assembly 700. The PCB assembly 750 of FIGS. 7A-7C comprises a PCB 752 with a dipole antenna 758 being mounted thereon. There is also a steerable antenna controller and RF emissions diagnosis module 760, which also may house an emissions processing logic unit. The PCB assembly 750 also comprises connectors 754, 756 so as allow addition of replaceable emissions processor module 770 and additional antenna module 780. The replaceable emissions processor module 770 can comprise an RF receiving and/or processing module 772 as well as connectors 774 to mate with connectors 754 or 756. The additional antenna module 780 comprises an antenna 782, being illustrated as a loop antenna, a filter 784, an LNA 786 and connectors 788 to mate with connectors 754 or 756.

Antenna card 100, 200, 300, and 700, as well as antenna modules such as 780 may be attached to the end of the robotic arm replacing antenna 586 of FIG. 5.

Figure 8:
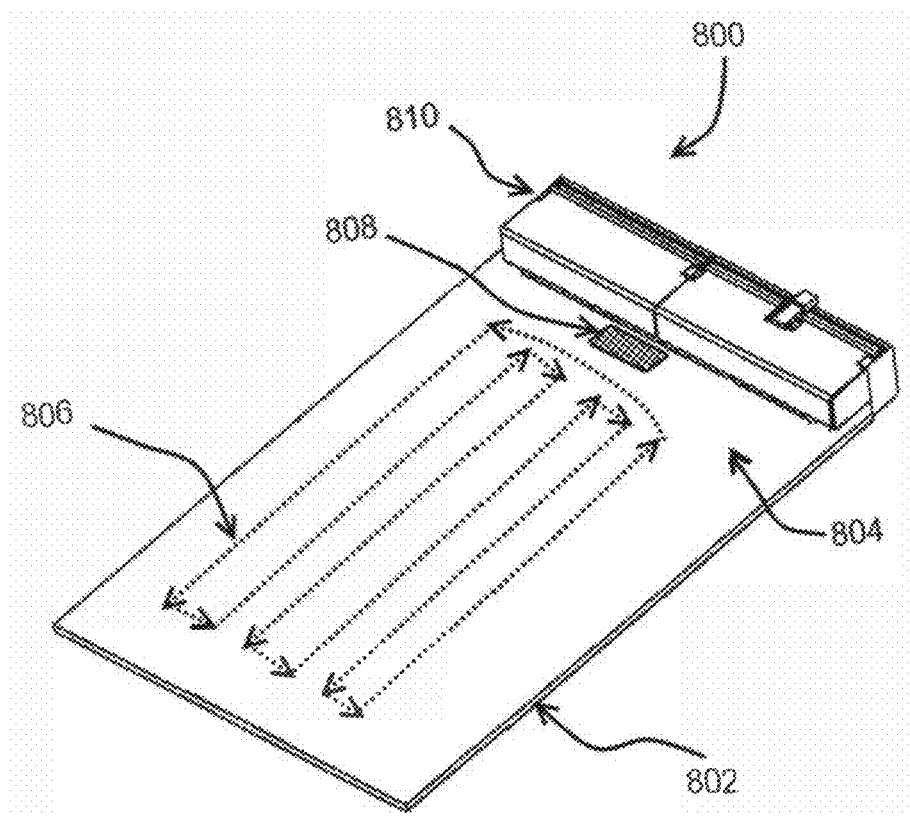
FIG. 8 illustrates an exemplary rastering path of a robotically movable antenna.

FIG. 8 illustrates an exemplary PCB assembly 800 with an example scan pattern 806 of Robotically Moveable Antenna across different of the PCB substrate 802, for example such as the antenna 586 of FIG. 5. Antenna module 804 containing antenna 808 can be also provided. A backplane connector 810 can be also provided.

Figure 9:
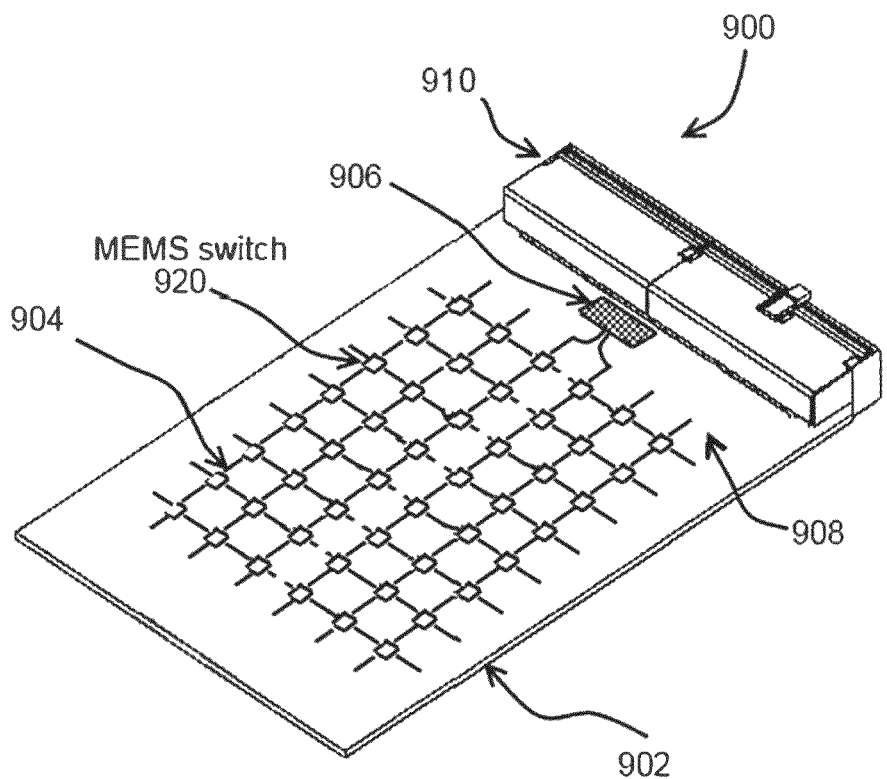
FIG. 9 illustrates an exemplary reconfigurable antenna on a PCB card.

FIG. 9 illustrates a configurable antenna board or emissions processor board 900 with MEMS configurable antenna. The antenna array configured by MEMS switches 920 and antenna wire elements 904 are provided on the substrate 902 and are operatively connected to and are controlled by controller 906. The received emissions may be processed in 906 for detection of emission abnormalities or sent through card connector 910 to a trace and to a processing card in the same rack or chassis. The antenna board 908 can house the RF emissions processing controller 906. The RF emissions processing controller (module) 1006 can be of any type of FIGS. 12, 16, 17, 22 or similar.

FIG. 9 illustrates an example reconfigurable antenna on a PCB card 900 with a reconfigurable antenna composed of antenna wire elements 904 reconfigured by RF MEMS switches 920 to form antennas of many shapes, frequency responses, and configurations.

Figure 10:
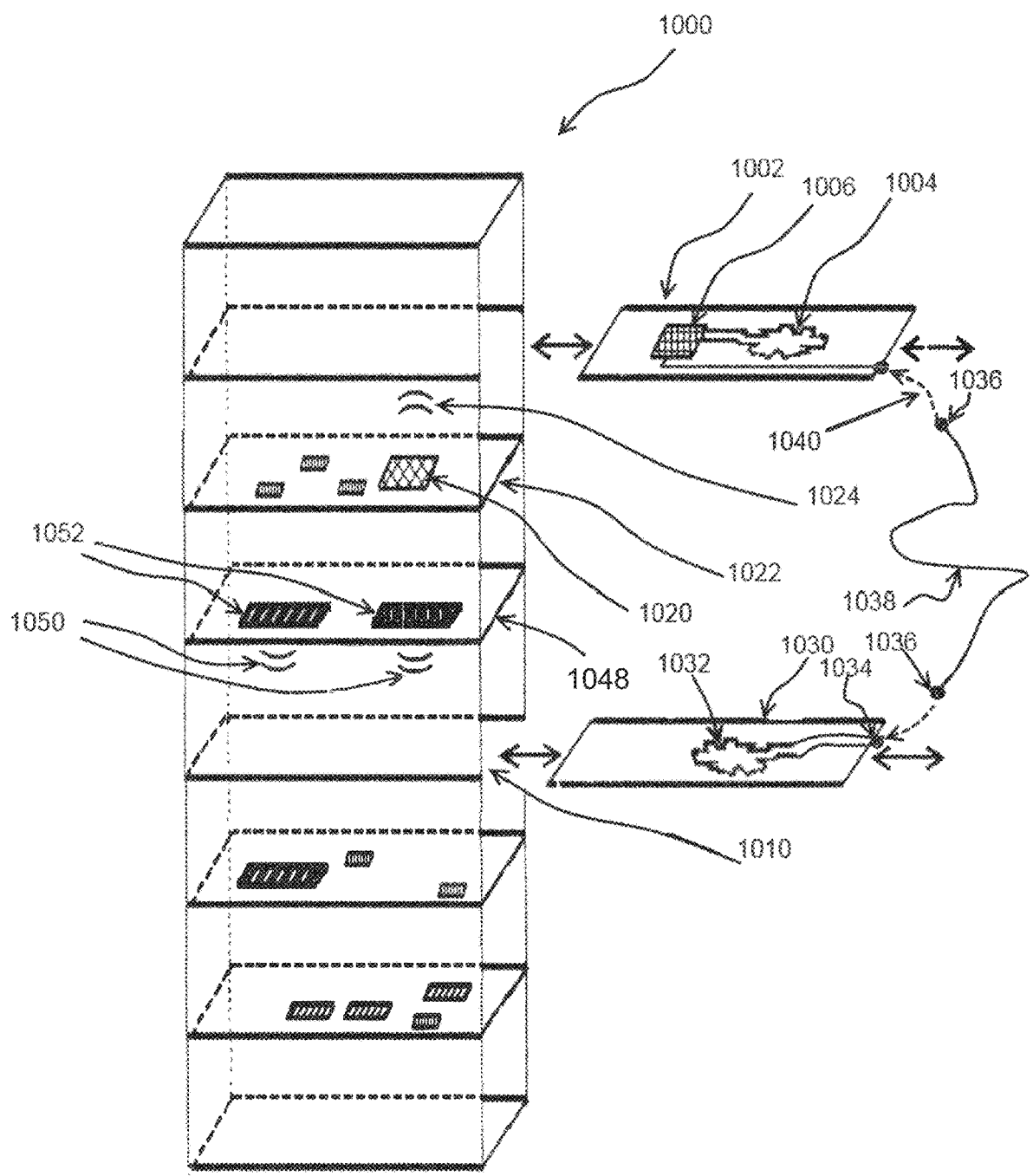
FIG. 10 illustrates an exemplary card rack with removable/replaceable emission processing card.

FIG. 10 illustrates chassis 1000 containing PCB cards to be monitored. The chassis 1000 comprises one or more PCB assemblies 1022 containing at least one semiconductor device 1020 that emits RF emissions 1024, and/or PCB assembly 1048, containing at least one semiconductor device 1052 that emits RF emissions 1050. The chassis 1000 further comprises one or more RF emissions monitoring/processing card 1002 and an antenna card 1030. The RF emission processing card 1002 is illustrated as comprising a fractal antenna 1004 coupled to RF emissions processing module 1006. The RF emissions processor module or controller 1006 can be of any type of FIGS. 12, 16, 17, 22 or similar. The antenna card 1030 can simply comprise fractal antenna 1032 coupled to RF connector 1034. The RF emission processing card 1002 and antenna card 1030 can be connected therebetween with the coaxial cable 1038 with mating RF connectors 1036 and an optional coaxial cable 1040 so that the controller 1006 can also process RF emissions from the antenna card 1030. Either antenna card can be simply installed into the card slot, for example such as an empty card slot 1010. In this embodiment, the RF emission processing card 1002 is configured to at least receive and optionally process the emissions 1024 from one or more semiconductor devices 1020 and the antenna card 1030 is configured to receive RF emissions 1050 from at least one semiconductor device 1052 to be processed by the controller 1006. Removable/replaceable emission processing card 1002 and antenna card 1030 can populating previously empty slots, for example such as slot 1010.

Figure 11:
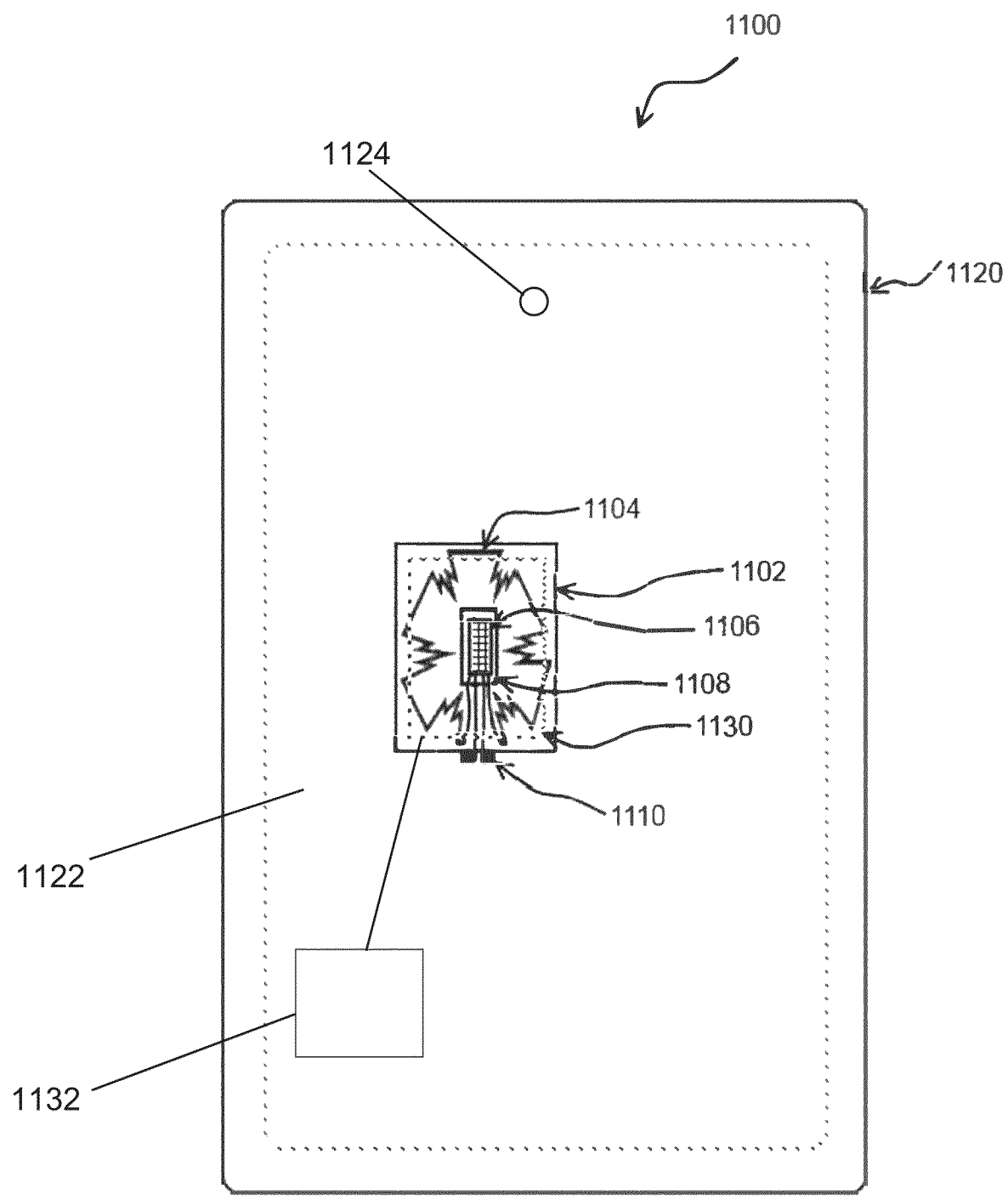
FIG. 11 illustrates an exemplary unintended emissions processing board, Multi-Chip-Module (MCM) or module inside a smartphone configured to monitor emissions from a smartphone chip.

FIG. 11 illustrates a mobile communication device 1100, for example such as a smartphone that comprises a housing 1120, a display 1122, one or more cameras 1124, one or more processors 1130 and a non-transitory computational medium 1132 comprising executable instructions that, when executed by said one or more processors, cause said one or more processors to perform operations of the smartphone 1100. Emissions from the one or more processors 1128 are being captured and monitored/evaluated by an internally mounted emissions processing Multi-Chip-Module (MCM) or module assembly 1102 comprising an antenna module 1104 coupled to a controller 1108 containing a die 1106. In other words, the controller 1108 can be provide as a system-on-the-chip and can further include the antenna. A single die 1106 can be replaced by more than one interconnecting processing dies in a stacked configuration. Or, the die 1106 can be provided as a multichip module with logic, circuitry and processor power to evaluate emissions from 1130. The output from the module assembly 1102 can be communicated through the RF connector 1110. The mobile communication device 1100 can be a tablet, a pad, a smart watch, a computer or any other electrical assembly employing at least one (micro) processor. It is to be understood that the die-mounted antenna and/or controller can be used in other embodiments described herewithin.

Figure 12:
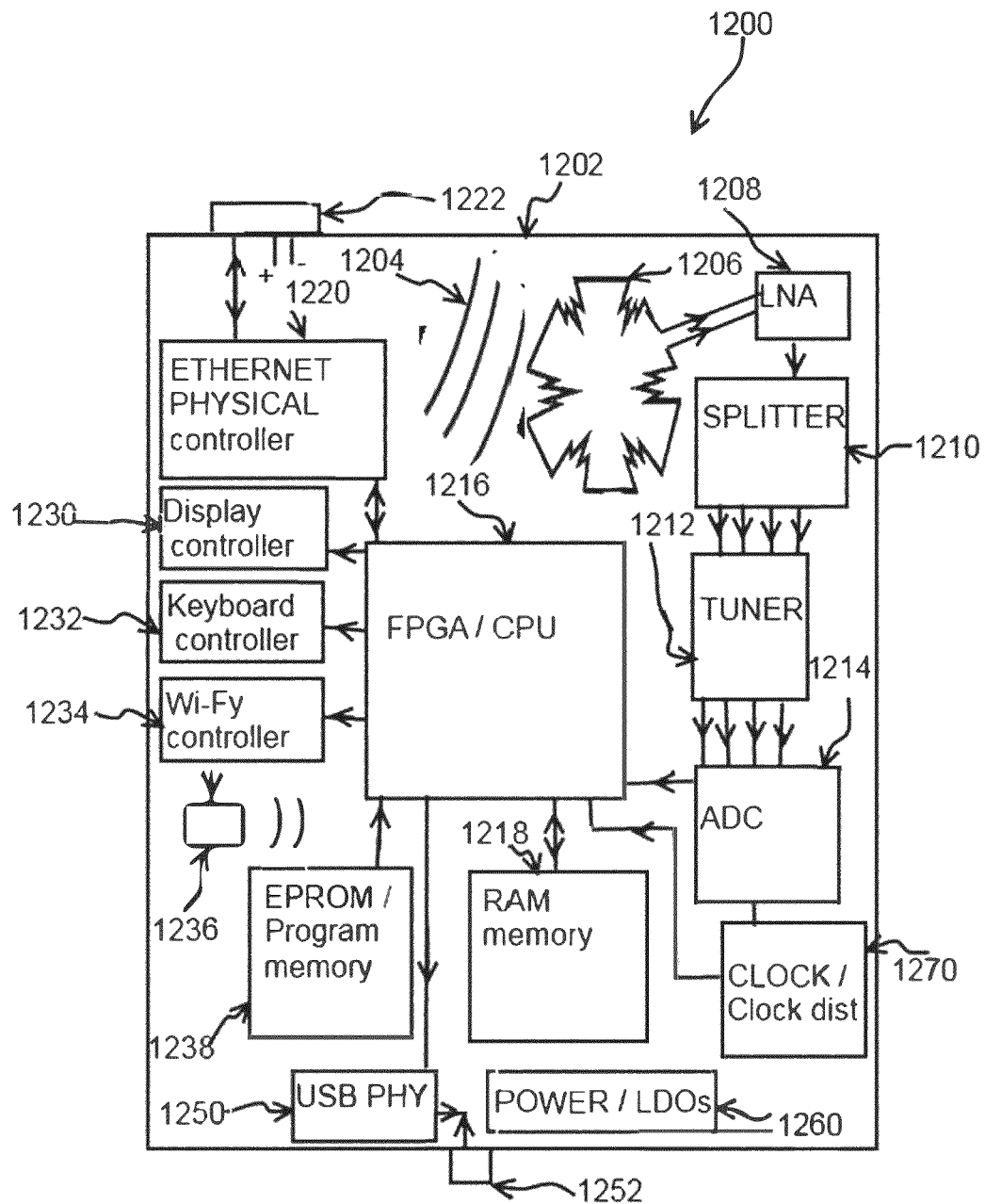
FIG. 12 illustrates an exemplary hardware diagram of one of many possible exemplary embodiments of emissions processor board.

FIG. 12 illustrates a block diagram of an exemplary architecture 1200 configured to receive and process emissions of RF energy. This exemplary architecture 1200 can include a PCB substrate 1202 with a bus connector 1222. In this embodiment, a fractal antenna 1206, capturing RF emissions 1204, is contemplated as being integrated into the architecture 1200. However, the antenna or the antenna module of any of the described embodiments, can be coupled to the architecture 1200 by way of the cable or any other suitable means, including a daughter-board approach. Furthermore, the antenna 1206 can be any one of the above described types. The arrows between successive blocks in the block diagram also represent the signal path taken by the captured RF emissions from the antenna 1206, through an LNA 1208, splitter 1210, tuner 1212, ADC 1214 into the FPGA/CPU 1216. Here, the splitter 1210 can be an RF splitter that equally routes the incoming signal into four channels of the device, typically to process different frequency regions by each channel. This is illustrated by the four arrows between the splitter 1210 and the tuner 1212. Other number of channels can be used. Each channel represents a separate data throughput path. The FPGA/CPU 1216 can comprise one or more processors. Such one or more processors can be typically used for down converting and FFT generation. A display controller 1230 can be provided. Any one of the Ethernet physical controller 1220, keyboard controller 1232 and Wi-Fi controller 1234 can be also provided. The four controllers 1220, 1230, 1232, and 1234 can be integrated into a single controller The FPGA/CPU 1216 requires a clock signal to maintain normal operation. This clock signal can be provided as an on-board or co-located hardware block 1270 or can be coupled from an external source. Output from the FPGA/CPU 1216 can be provided through the USB PHY block 1250 to a connector 1252 and externally connected USB device such as Flash memory, Ethernet hub, computer, database, or internet cloud storage. A non-volatile memory block (EPROM, EEPROM) 1238 is also provided within the device as a means to at least store historical records of degradation values and interface with a user. The random access memory block 1218 may be an internal part of the computer, a removable external element coupled to the computer, or unit that is remotely accessible via a wired or wireless network. Power for the board can be supplied in this embodiment via a chargeable or non-chargeable battery 1260. Further embodiments contemplate power being supplied via a DC power supply.

The memory 1218/1238 is not a transitory propagating signal. The memory connected to one or more processors and encoding computer readable instructions, including processor executable program instructions, the computer readable instructions accessible to the one or more processor, wherein the processor executable program instructions, when executed by the one or more processors, cause the one or more processors to perform operations on the RF emissions captured by the antenna and received by the receiver.

In other words, FIG. 12 illustrates a block diagram of one of many possible exemplary embodiments of an emissions processor board 1200 with an antenna 1206 to receive the emissions through to a bus connector 1222 or USB port 1252 to communicate results or status external to the emissions processor board.

It is also contemplated that the LNA 1208, the splitter 1210, the tuner 1212 and ADC 1214 define a RF receiver, while the FPGA/CPU 1216, RAM memory 1218 and EPROM/Program memory 1238 define a controller. RF receiver and controller can be provided on separate PCB substrates and coupled with each other by way of connectors, cables or in a mother-board/daughter-board approach. PCB substrate 1202 can be an enclosure.

Figure 13:
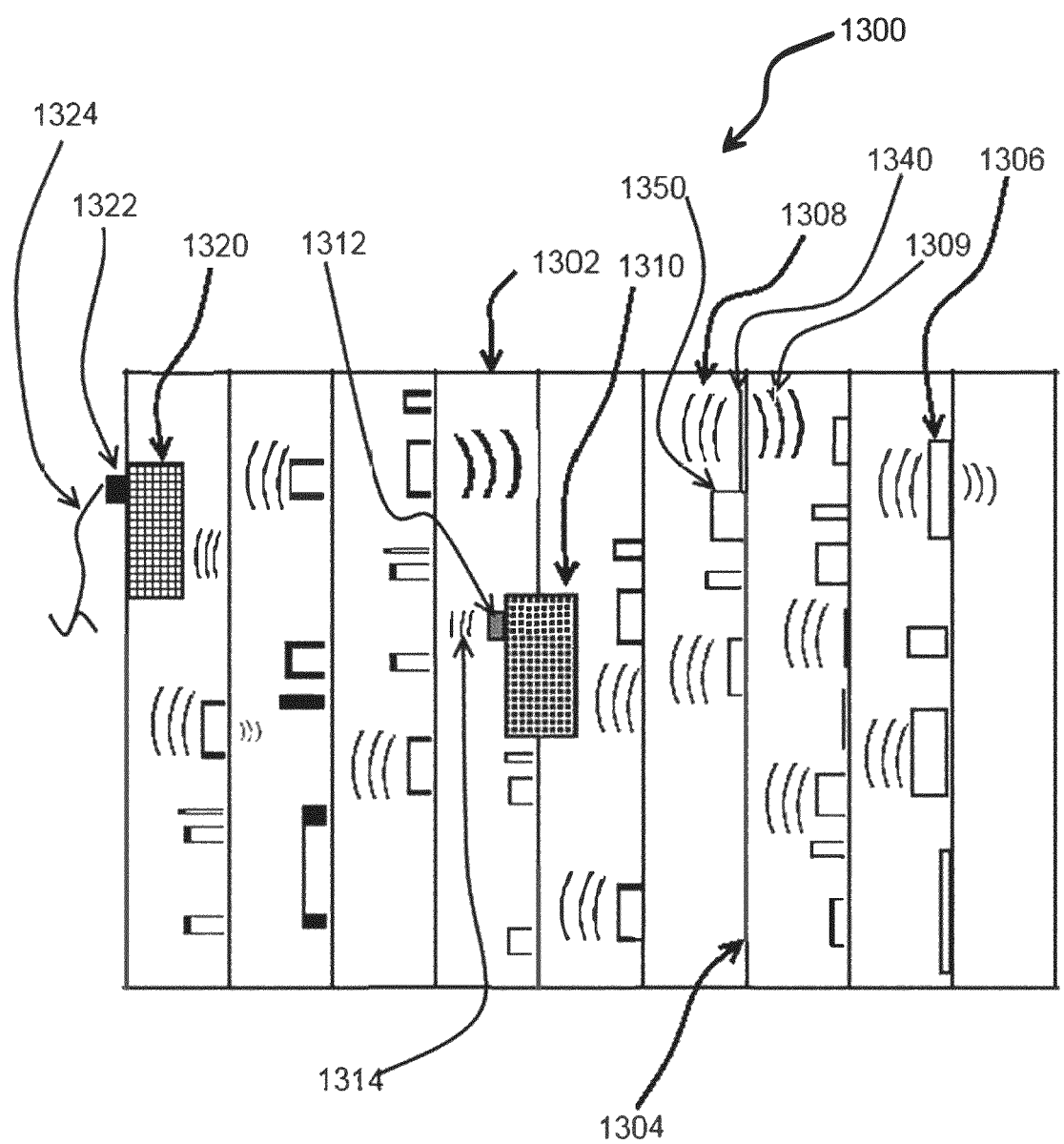
FIG. 13 illustrates exemplary hardware embodiment of modules which can be added to a rack to monitor emissions, without requiring a card slot.

FIG. 13 illustrates an exemplary equipment rack or chassis assembly 1300 with RF emissions processing modules 1310 and 1320 outside the card rack 1302 containing antennas 1312 and communication cable connector 1322, for example of a RJ45 type, receiving emissions from components, for example such as a processor card containing Chips 1304, 1306 to be monitored and emitting intended or unintended emissions inside the rack and communicating results by Wi-Fi module 1314 or a wired communication cable 1324. In other words, FIG. 13 illustrates a hardware embodiment of modules 1310, 1320, which can be added to the rack or chassis assembly 1300 to monitor emissions 1308, without requiring a separate card slot. Also illustrated are unintended emissions 1308, 1309 emanating from a trace element 1340.

Figure 14:
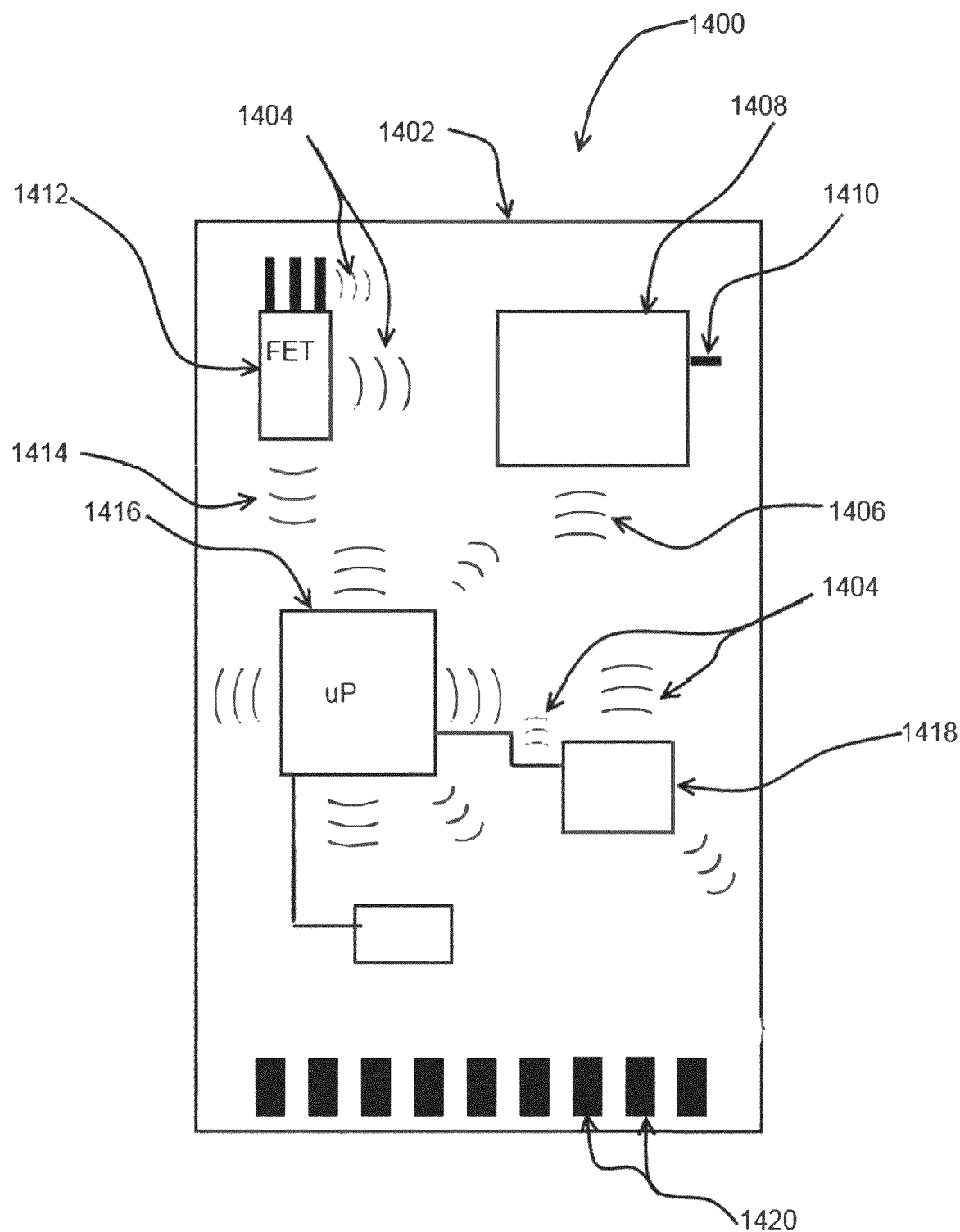
FIG. 14 illustrates an exemplary hardware embodiment of emission processing module.

FIG. 14 illustrates an exemplary circuit card 1400 with card edge connectors 1420 at one edge of a card substrate 1402. The circuit card 1400 also illustrates components that can emit RF emissions to be received and processed by a processing module 1408. Such components can include FET 1412 and RF emissions 1404, 1414 therefrom, microprocessor 1416 emitting RF emissions 1417, RAM member 1418 emitting RF emissions 1404A and others. Also emitted RF emissions can be received, as RF emissions 1406, by the processing module 1408, adapted with power and communications traces into board and card edge connectors 1410 for a communication of results external to the circuit card 1400.

Figure 15:
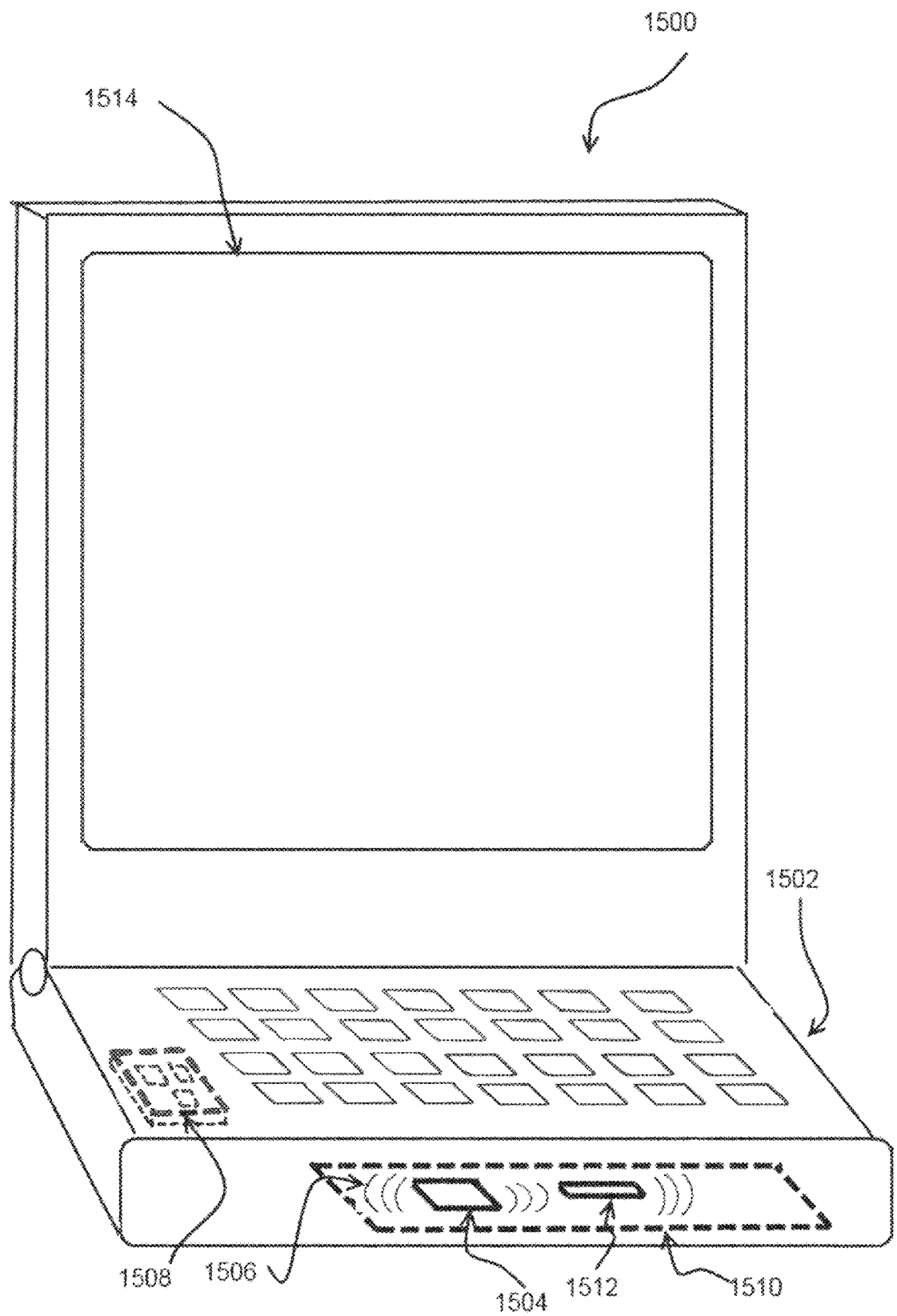
FIG. 15 illustrates an exemplary laptop with an emission processing module monitoring emissions from processing elements.

FIG. 15 illustrates a laptop (or any other computer) 1500 with at least a laptop processor 15004 and with a screen 1514. An RF emissions processing module 1508 is also provided within the laptop 1500 and receives and examines emissions from laptop logic chips 1510 and 1512 generating at least emissions 1506. Results of the examination may be recorded for further study or may cause the laptop 1500 to be shut down. The RF emissions processing module 1508 can be of any type as disclosed in FIGS. 12, 16, 17, and 22.

Figure 16:
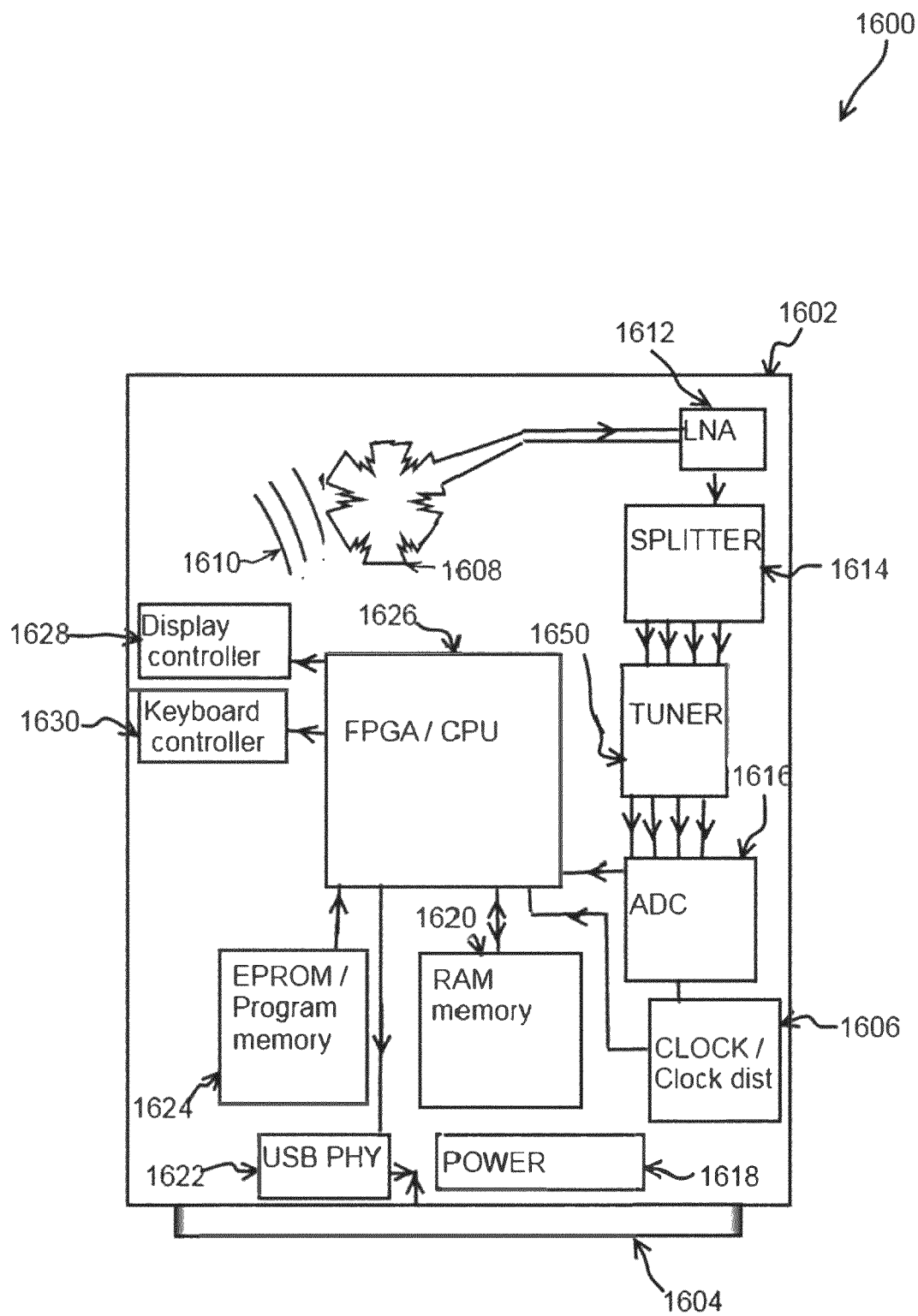
FIG. 16 illustrates an exemplary emissions processing card that can send emission processing results through a bus connector.

FIG. 16 illustrates a block diagram of an exemplary architecture 1600 configured to receive and process emissions of RF energy. This exemplary architecture 1600 can include a PCB substrate 1602 with a bus connector 1604. In this embodiment, a fractal antenna 1608, capturing RF emissions 1610, is contemplated as being integrated into the architecture 1600. However, the antenna or the antenna module of any of the described embodiments, can be coupled to the architecture 1600 by way of the cable or any other suitable means, including a daughter-board approach. Furthermore, the antenna 1608 can be any one of the above described types. The arrows between successive blocks in the block diagram also represent the signal path taken by the captured RF emissions from the antenna 1608, through an LNA 1612, splitter 1614, tuner 1650, ADC 1616 into the FPGA/CPU 1626. Here, the splitter 1614 can be an RF splitter that equally routes the incoming signal into four channels of the device, typically to process different frequency regions by each channel. This is illustrated by the four arrows between the splitter 1614 and the tuner 1650. Other number of channels can be used. Each channel represents a separate data throughput path. The FPGA/CPU 1626 can comprise one or more processors. Such one or more processors can be typically used for down converting and FFT generation. A display controller 1628 can be provided. A keyboard controller 1630 can be also provided. The controllers 1626, 1628, and 1630 can be integrated into a single controller The FPGA/CPU 1626 requires a clock signal to maintain normal operation. This clock signal can be provided as an on-board or co-located hardware block 1606 or can be coupled from an external source. Output from the FPGA/CPU 1626 can be provided through the USB PHY block 1622 to a connector 1604 and externally connected USB device such as Flash memory, Ethernet hub, computer, database, or internet cloud storage. A non-volatile memory block (EPROM, EEPROM) 1624 is also provided within the device as a means to at least store historical records of degradation values and interface with a user. The random access memory block 1620 may be an internal part of the computer, a removable external element coupled to the computer, or unit that is remotely accessible via a wired or wireless network. Power for the board can be supplied in this embodiment via a chargeable or non-chargeable battery 1618. Further embodiments contemplate power being supplied via a DC power supply.

The memory 1620/1624 is not a transitory propagating signal. The memory connected to one or more processors and encoding computer readable instructions, including processor executable program instructions, the computer readable instructions accessible to the one or more processor, wherein the processor executable program instructions, when executed by the one or more processors, cause the one or more processors to perform operations on the RF emissions captured by the antenna and received by the receiver.

It is also contemplated that the LNA 1612, the splitter 1614, the tuner 1650 and ADC 1616 define a RF receiver, while the FPGA/CPU 1626, RAM memory 1624 and EPROM/Program memory 1624 define a controller. RF receiver and controller can be provided on separate PCB substrates and coupled with each other by way of connectors, cables or in a mother-board/daughter-board approach. PCB substrate 1602 can be an enclosure.

Figure 17:
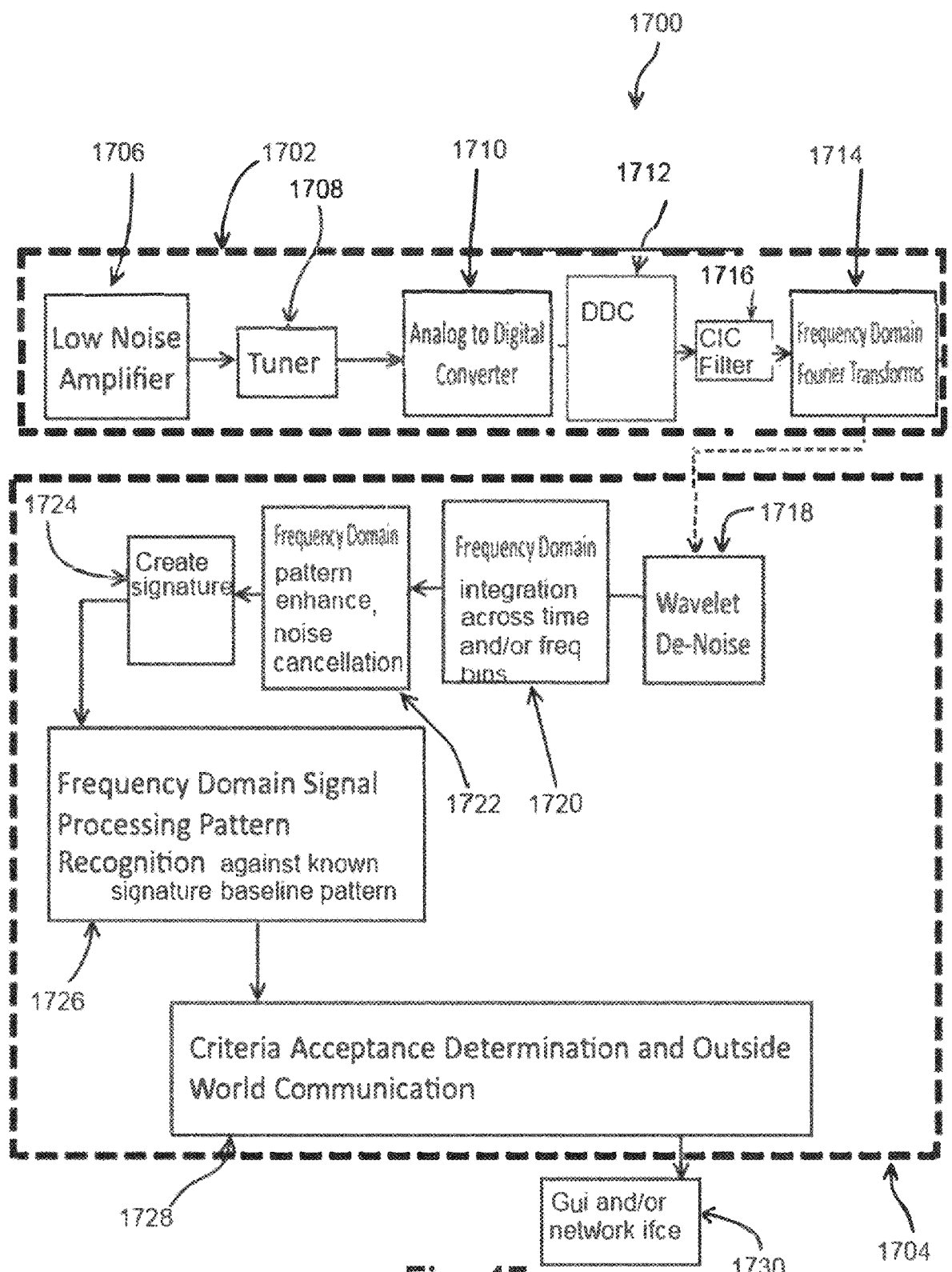
FIG. 17 illustrates an exemplary functional block diagram of hardware and software operations inside an emissions processing module.

FIG. 17 illustrates a functional block diagram of typical hardware 1702 and software operations 1704 inside an RF emissions processing module 1700. FIG. 17 also illustrates a block diagram of an exemplary method 1700 describing how captured RF (emission) energy is acquired, processed and algorithmically compared to a set of parameters identified for a baseline configuration of an aged or unaged DUT. It is to be understood that such logic architecture is carried out by one or more on-board processors executing non-transitory computer readable medium comprising executable instructions, though it also contemplates other hardware or firmware manifestations to assist or perform the comparison algorithms of verifying a match with the anticipated parameters. The non-transitory computer readable medium has a program recorded thereon for executing the method (performing operations).

FIG. 17 illustrates two functional blocks 1702 and 1704. The functional block 1702 can be also referred to as or defines an RF receiver, while the functional block 1704 can be also referred to as or defines a controller. These functional blocks can be provided independently from each other or can be incorporated into a single apparatus (single circuit card/board or single integrated circuit).

Functional block 1702 can be considered as a front end signal acquisition and raw data processing block, and contains an LNA 1706, a tuner 1708, an analog-to-digital converter 1710, Digital Down Converter (DDC) 1712, a Cascade Integrator-Comb (CIC) filter 1716 and a Fourier Transform (FFT) block 1714. As discussed in the embodiments herein, the acquired emissions signal(s) pass through the LNA 1706 for low-intensity-signal amplification. In this embodiment, the tuner that is housed within the functional block 1708 may be of RF tuner type and can be a general receiver or tuner and the general receiver can be a heterodyne or super-heterodyne receiver or equivalent. The received RF emissions are then digitized in the ADC block 1710, converting the raw analog time domain voltages into digital values for processing. One key factor in determining the quality of signal fed into the overall system can be the linearity, number of bits (Effective Number of Bits (ENOB)) and speed of the ADC 1710. A higher ENOB for example generates less noisy data resulting in more accurate and/or faster modified/unmodified determination decisions.

The acquired emissions signal(s) is/are passed then through digital down conversion 1712, which converts the digitized signal to a lower frequency signal at lower sampling rate (decimation). The DDC 1712 may consist of a Direct Digital Synthesizer (DDS), a low-pass filter, and/or a down-sampler for decimation.

Logic step 1714 executes a frequency domain Fourier Transform to convert the data in the digital CIC filter 1716 into the wavelet de-noising block 1718 for further processing in the data processing block 1704. In at least one exemplary embodiment, time-domain emission signal data is transformed to the frequency domain by means of a Fast Fourier Transform (FFT) 1714. Electromagnetic signature elements and signature region 2-D patterns for comparison purposes can be extracted across a wide frequency band via quantitative analysis. Such signature elements for quantitative analysis may include averaged or statistical quantities representing measurements including the noise floor level, phase noise distribution, absolute and relative peak locations to other peaks, non-linear product peak envelope shape, and the structure of identified peaks.

From there, the now-frequency-domain signature, after undergoing Fourier Transform 1714, is now filtered 1720 and integrated 1722, producing the measured frequency domain signature 1724 that is to be quantitatively analyzed, diagrammed by block 1726. This block 1726 derives the relevant metrics from the measured device and uses the quantified metrics to determine a RUL value. One or more algorithms in step 1724 can be executed to match the collected emission signature data to the expected emission signature for the DUT. More than one algorithm may be used to match mutually exclusive parameters of the RF energy emission signature and then combine those using numerically weighted coefficients for each in a linear or nonlinear equation to yield a final Remaining Useful Life value for the DUT. Thus, logic set 1726 typically includes at least one of Harmonic Analysis, Matched Filter, non-harmonic correlation, timing correlation, Artificial Neural Networks (ANN), specifically multilayer perception (MLP) feed-forward ANN with back propagation (BP), Wavelet Decomposition, Autocorrelation, Spectral Feature Measurements or Statistics, Clustering or Phase Detrending algorithms. The signature library may be loaded or programmed with datasets for known degradation behavior. The measured dataset can be located within a 2-D or possibly the multi-dimensional signature element space. This location may be transformed to a two or three-dimensional space using Principal Component Analysis (PCA), after which the distance between the device under test and cluster centers for each degradation category may be determined. If the measured dataset falls within threshold of a known degradation cluster, the algorithm declares the device to have a degradation of that category. If the measured dataset falls outside the bounds of known degradation behavior, the device will be declared to be free of imminent failure, significant RUL, etc. Communication of results with an external environment can be performed by instructions and hardware within the block 1728 and may be displayed on GUI 1730 or communicated to a remote device, computer, server (not shown)

The detection algorithms can also be run offline on raw time domain or frequency domain data acquired elsewhere and/or previously using the system or in a fully automated manner. Automation of the test algorithm and integration within the embedded software architecture is accomplished to fully automate screening of degraded Device components for hardware elements such as parts, boards, or subsystems used and/or in the ADUT. The characteristic signature regions for DUT with hardware degradation is measured. The detection algorithms detect signature elements associated with the degradation. Algorithm results can be used to determine what should be disqualified and/or quarantined.

Detection algorithms or instructions, executed by one or more processors, facilitate detection of degradation and such detection is accomplished in one exemplary embodiment through algorithms that target emission signature elements identified to be of significance. The algorithms or instructions, executed by one or more processors, may encompass multiple stages, starting for example with raw time-domain emission data and ending with an assessment of whether a faulty or degraded device is present in the device under test, inspection and/or examination.

Figure 18:
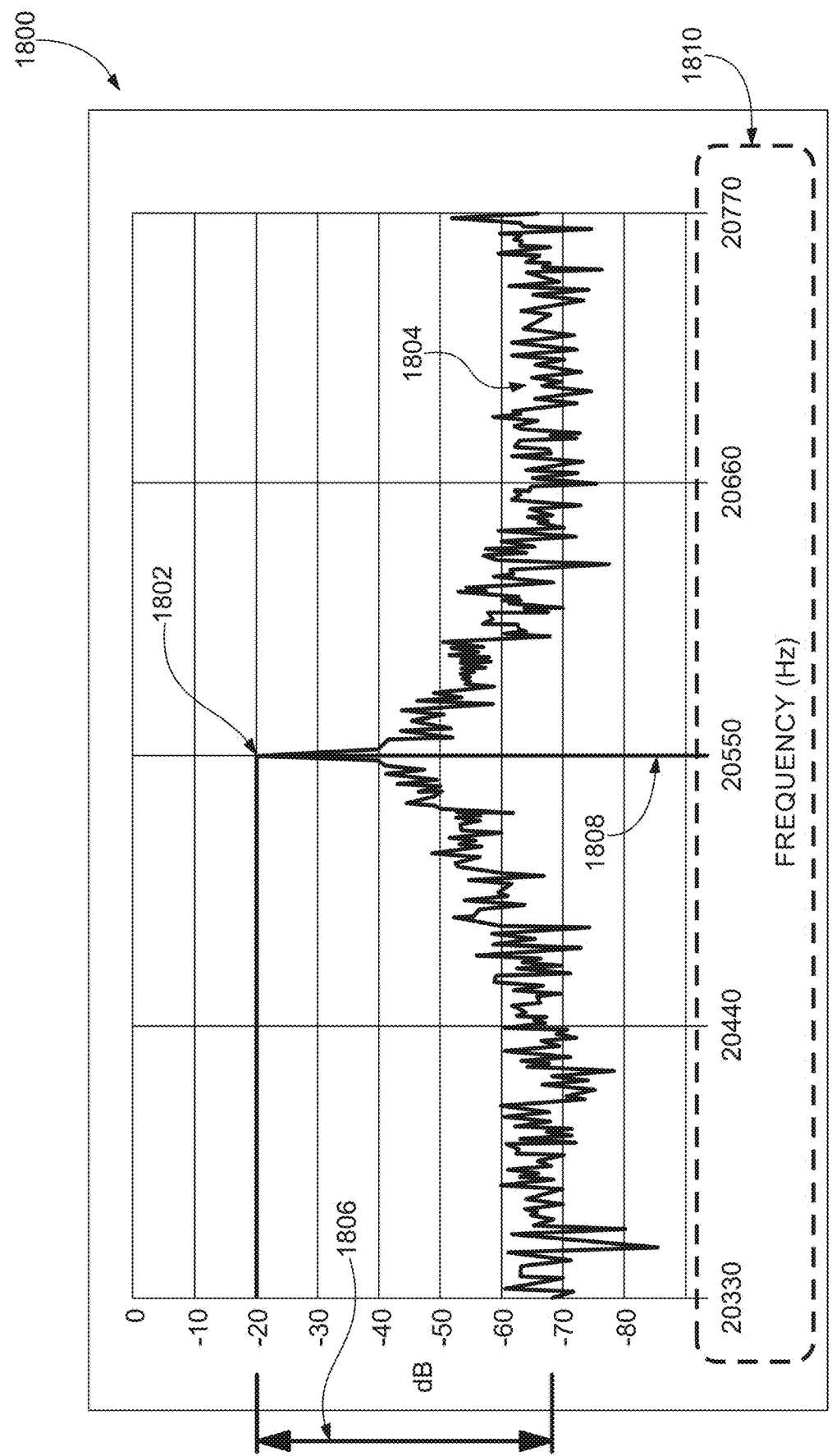
FIG. 18 illustrates an exemplary spectrum showing features that can be examined by the emissions processing apparatus.

FIG. 18 illustrates an example emissions peak's characteristics to be measured such as peak height 1806 and frequency location 1810 and noise floor 1804 location. In FIG. 18, the spectral feature is a central peak 1802 with characteristic amplitude 1806, a characteristic peak position 1808, and characteristic noise floor 1804. This feature also appears in the region of interest 1810 20330-20770 Hz. In this contemplation, the peak positon 1808 is a quantifiable indicator of RUL of the DUT. Specifically, a baseline DUT will produce a characteristic peak position, such as 1808. As the DUT ages progressively, the peak position 1808 will move along the horizontal axis, in a trend-like fashion that is correlative to the device's aging curve. Contemplations of this shift in peak frequency can include either positive or negative shifts in peak frequency. The exemplary apparatus of FIG. 1, 2 or 3 can detect these shifts and use their quantification to determine the DUT's RUL.

In an embodiment, the peak amplitude 1806 is a quantifiable indicator of RUL of the DUT. Specifically, a baseline DUT will produce a characteristic peak amplitude 1806. As the DUT ages progressively, the peak amplitude 1806 will either increase or decrease, in a trend-like fashion that is correlative to the device's aging curve. Contemplations of this change in peak amplitude can include either positive or negative change. The apparatus of FIG. 1, 2 or 3 can detect these changes in amplitude and use their quantification to determine the DUT's RUL.

It is to be noted that the illustrated signature features are not limited to the frequency region indicated. This frequency region can be in any sub-region within the RF range, 3 kHz to 300 GHz.

Figure 19:
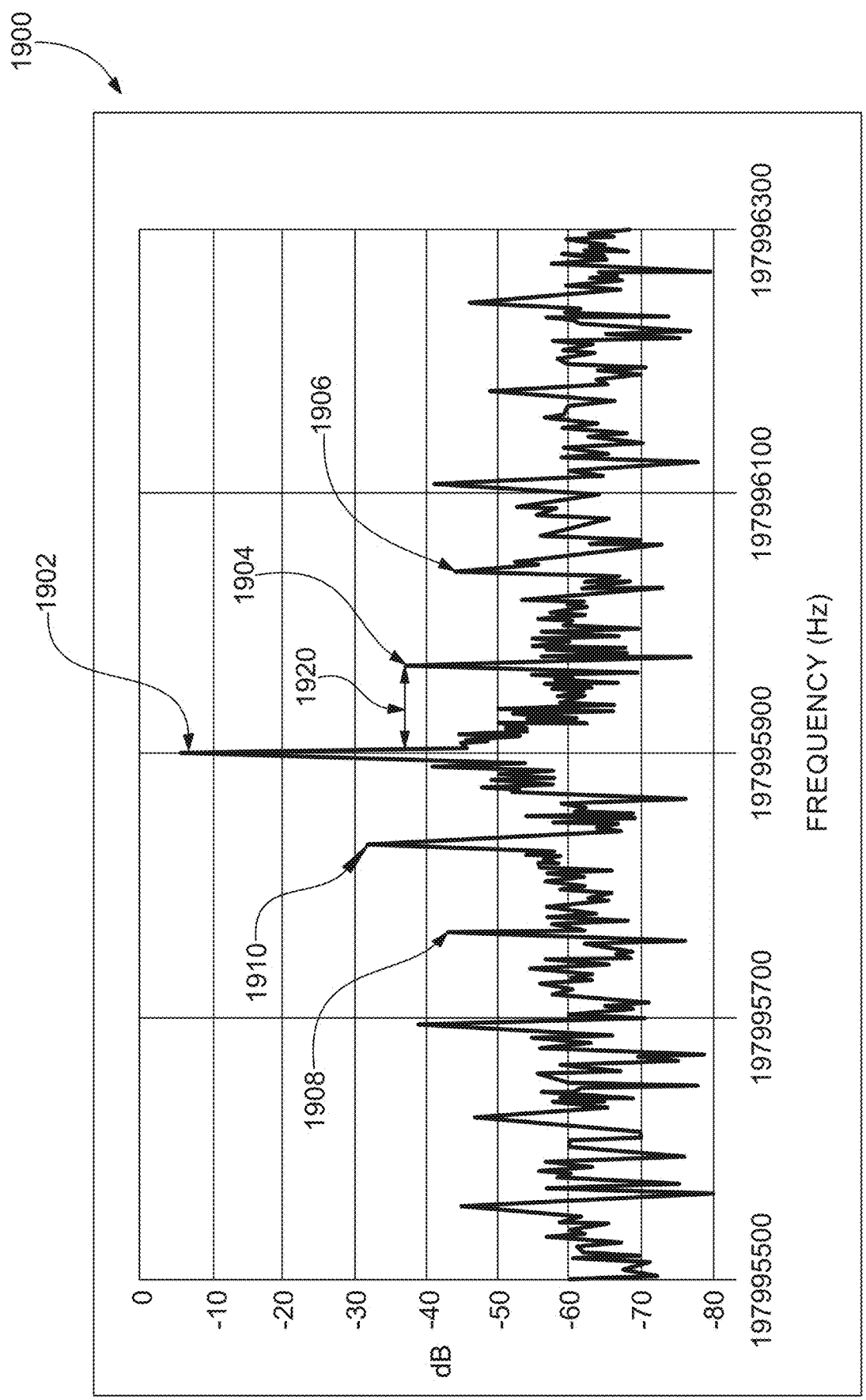
FIG. 19 illustrates intermodulation peaks that can be examined by the emissions processing apparatus.

FIG. 19 shows an example emissions peak's characteristics to be measured such as Cross Modulation Content/Amplitude Envelope of peaks 1904, 1906, 1908, 1910 symmetrically arranged around center peak 1902. Change in intermodulation peaks distance 1920 from center peak 1902 and each subsequent cross modulated product may indicate unacceptable operational states.

Coupling of weaker internally emitted signals from an electrical or electronic device results in characteristic signature elements readily describable by established mathematical relationships. These characteristic signature elements are shown as 1906 in FIG. 19, and manifest as a series of sharp Delta-like peaks that are symmetrically spaced around a center peak. The center peak is shown as 1902 in FIG. 19. The characteristic frequency spacing between the center peak and each subsequent cross modulation product is called out as 1904, and provides a characteristic metric for determining Remaining Useful Life. The general expression for a modulated signal can be written as shown in Equation 2.

$$v_M(t) = A_c \cos(2\pi[f_c + g_{mod}(t)\Delta\eta]t) \quad \text{Equation 2}$$

For a modulating signal gmod(t)=cos(2πfmt), Equation 2 can be expanded using Bessel trigonometric identities, shown in Equation 3. The nth order Bessel Function of the first kind governs mixing characteristics such as frequency separation 1904, amplitude envelope of peaks 1906 comprising the emitted signature of cross modulation products.

$$S(t) = A \sum_{-\infty}^{\infty} J_n(\beta)\cos[(\omega + n\omega_{mod})t] \quad \text{Equation 3}$$

$$\beta = \frac{\Delta f}{f_b} = \frac{|f_0 - f_1|}{f_b}$$

For illustrative purposes, Equation 4 shows a Bessel function of the first kind; wherein n is the cross modulation peak index, and β is the modulation index.

$$J_{(n)(\beta)} = \sum_{k=0}^{\infty} \frac{-1^k \left(\frac{\beta}{2}\right)^{(n+2k)}}{k!(n+k)!} \quad \text{Equation 4}$$

The mixing characteristics of the cross modulation signature discussed above are governed by the value of the modulation index β. The value of beta, and hence the character of the spectrum 1900 are indicators of device age, meaning that the characteristic value of β is dependent on the age of the DUT in a characteristic way. This embodiment contemplates the calculating the value of β as part of the embedded software processing of the hand-held apparatus and using its functional relationship to device age to perform Remaining Useful Life prognostics of the DUT.

Figure 20B:
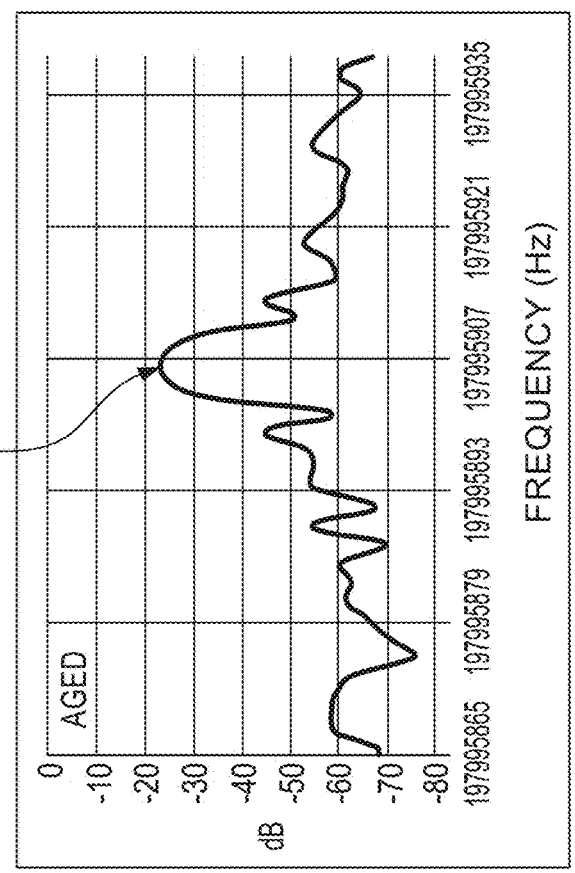
FIGS. 20A-20B illustrate change which can occur as a component degrades.
Figure 20A:
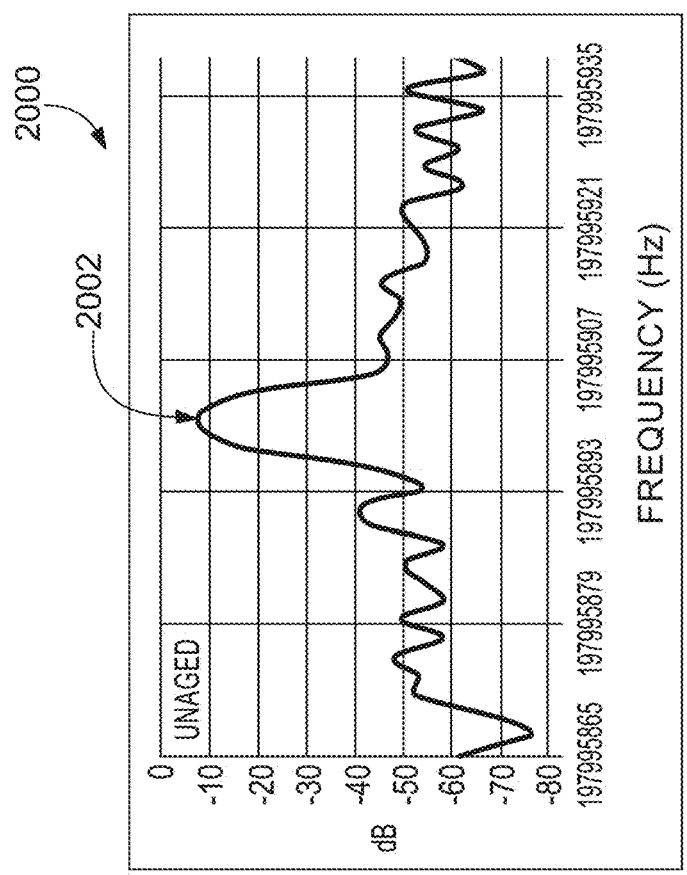

The apparatus in any of the described exemplary embodiments may consistently acquire the spectrum region shown as a spectrum region 2000 of FIG. 20A from a known good device, whereas the same spectrum region frequency, frequency span and resolution bandwidth shown in spectrum 2002 of FIG. 20B consistently acquired from an unknown device would be an indication it contained a degraded oscillator chip. As an example of spectral indicators of device aging, in comparison with non-degraded devices as seen in the spectrum region 2000 of FIG. 20B, degraded devices show a slightly wider FWHM value, additional phase noise attachment, and reduced SNR. A key consideration by the software algorithm can comprise a presence of such differences in features between the aged and unaged devices. These feature changes may manifest as a consistent evolution as the devices proceeds along its aging curve. These feature changes may manifest in the same frequency region for each device. Therefore, the logic may be programmed or configured to examine the acquired frequency spectrum either for presence of new peaks or an absence of previously detected peaks.

Thus, FIGS. 20A-20B illustrate example emissions from a device which is aged 2050 or partially degraded 2050 compared to a new, undegraded device's emissions 2000. A key utilized feature is peak height 2002 in the unaged device versus peak 2052 in the aged device.

Figure 21B:
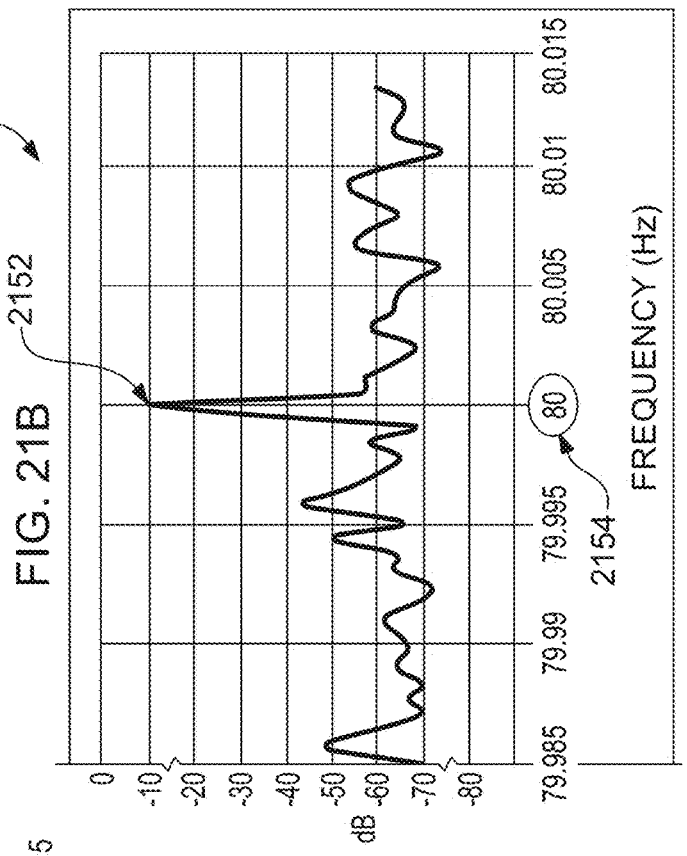
FIGS. 21A-21B illustrate a frequency shift of a peak that can indicate a significant change in functionality of a device.
Figure 21A:
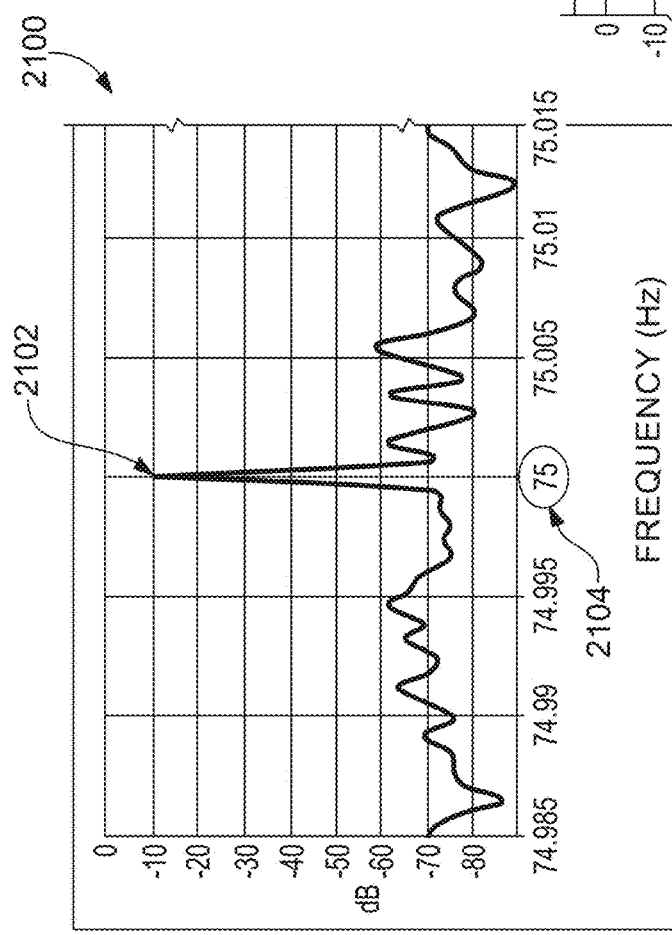

FIGS. 21A-21B illustrate an exemplary embodiment utilizing characteristics of harmonically related peaks to perform RUL prognostics. More specifically, FIG. 21 can illustrate a frequency shift of a peak indicating a significant change in functionality of a device. An exemplary RF emission signature consisting of two peaks, a peak 2102 at about 75 mHz and a peak 2152 at about 80 mHz, that are part of a harmonic spectrum. These signals represent the $15^{th}$ and $16^{th}$ harmonics of a 5 MHz fundamental frequency, as these peaks are centered at the $15^{th}$ and $16^{th}$ multiples of 5 MHz, the fundamental frequency. The frequency positions of these peaks are illustrated by 2104 and 2154. Aging of the DUT can result in the oscillator responsible for producing the 5 MHz fundamental frequency to experience jitter, which is a deviation from true periodicity in a periodic signal. Typically, electronic oscillators will be specified to a certain fundamental frequency, with a tolerance that is a small percentage of the fundamental oscillator. Aging of the DUT can result in the fundamental frequency shifting outside of the specified tolerance bounds. For example, the shift of the fundamental frequency due to aging can be measured as Δf. This results in the frequency positon of the higher order harmonics, 2104 and 2154 in FIGS. 21A-21B to deviate from its expected value by 15×Δf and 16×Δf, respectively. The measure of deviation from the expected peak value of these peaks is therefore an indicator of Remaining Useful Life of the DUT, and can be used to predict RUL via the software processes within the hand-held apparatus.

Figure 22:
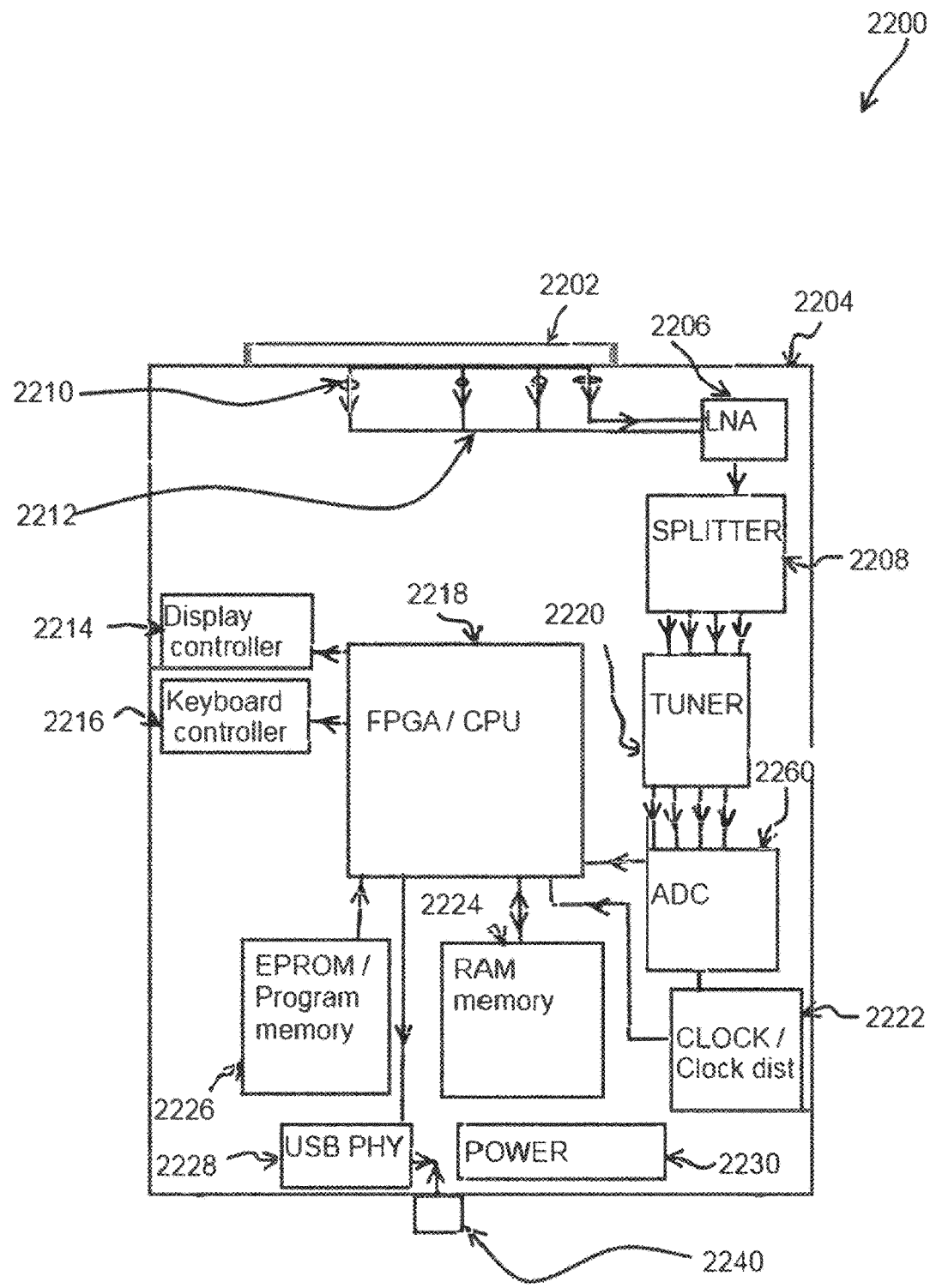
FIG. 22 illustrates an exemplary emissions processing card.

FIG. 22 illustrates a block diagram of an exemplary processing card 2200 configured to receive and process emissions of RF energy. The processing card 220 uses the backplane traces, card connector or traces to the connector for emissions input functioning as an antenna. It is to be understood that the exemplary processing card 2200 can receive unintended emissions through typically unused or low usage lines on the backplane it happens to be connected and sending results back out the connector 2202 and/or 2240. This exemplary processing card 2200 can comprise a PCB substrate 2204 with a bus connector 2202. The arrows between successive blocks in the block diagram also represent the signal path taken by the captured RF emissions from connector nodes 2210 and the connector path 2212, through an LNA 2206, splitter 2208, tuner 2220, ADC 2260 into the FPGA/CPU 2228. In other words, the connector nodes 2210 and/or the connector path 2212 defines an antenna. Here, splitter 2208 can be an RF splitter that equally routes the incoming signal into four channels of the device, typically to process different frequency regions by each channel. This is illustrated by the four arrows between the splitter 2208 and the tuner 2220. Other number of channels can be used. Each channel represents a separate data throughput path. The FPGA/CPU 2218 can comprise one or more processors. Such one or more processors can be typically used for down converting and FFT generation. A display controller 2214 can be provided. A keyboard controller 2216 can be also provided. The controllers 2214, 2216, and 2218 can be integrated into a single controller The FPGA/CPU 2218 requires a clock signal to maintain normal operation. This clock signal can be provided as an on-board or co-located hardware block 2222 or can be coupled from an external source. Output from the FPGA/CPU 2218 can be provided through the USB PHY block 2228 to a connector 2240 and externally connected USB device such as Flash memory, Ethernet hub, computer, database, or internet cloud storage. A non-volatile memory block (EPROM, EEPROM) 2226 is also provided within the device as a means to at least store historical records of degradation values and interface with a user. The random access memory block 2224 may be an internal part of the computer, a removable external element coupled to the computer, or unit that is remotely accessible via a wired or wireless network. Power for the board can be supplied in this embodiment via a chargeable or non-chargeable battery 2230. Further embodiments contemplate power being supplied via a DC power supply.

The memory 2224/1626 is not a transitory propagating signal. The memory connected to one or more processors and encoding computer readable instructions, including processor executable program instructions, the computer readable instructions accessible to the one or more processor, wherein the processor executable program instructions, when executed by the one or more processors, cause the one or more processors to perform operations on the RF emissions captured by the antenna and received by the receiver.

It is also contemplated that the LNA 2206, the splitter 2208, the tuner 2220 and ADC 2260 can define a RF receiver, while the FPGA/CPU 2218, RAM memory 2224 and EPROM/Program memory 2226 can define a controller. RF receiver and controller can be provided on separate PCB substrates and coupled with each other by way of connectors, cables or in a mother-board/daughter-board approach. PCB substrate 2204 can be an enclosure.

Figure 23:
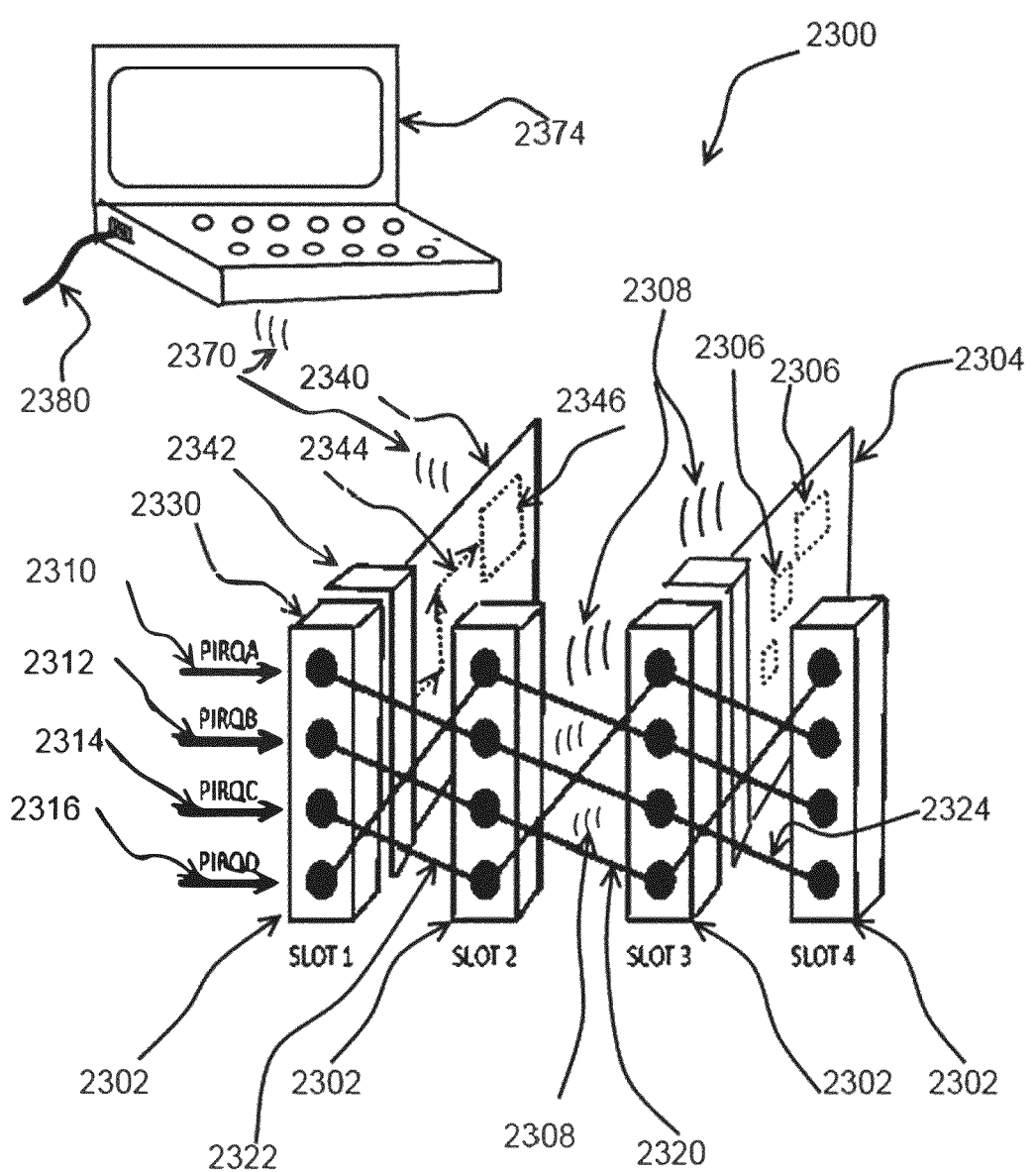
FIG. 23 illustrates how emissions sent by chips may be coupled through backplane traces.

FIG. 23 illustrates intended or unintended RF emissions 2308 emitted from semiconductor devices 2306 on another card (PCB assembly) 2304 to backplane traces, especially that can be seldom used or unused traces 2322, 2320, 2324 to example seldom used/unused interrupt lines 2310, 2312, 2314, 2316 then to RF processor board 2340 that examines emissions from backplane traces through connectors 2330 and 2332 and a trace 2344 to emissions processor semiconductor device (module) 2346 on the board 2340. Emissions processor semiconductor device (module) 2346 can then transmits a Wi-Fi signal 2370 to a laptop computer or any other processing device 2374 (for example such as smartphone) to be displayed for further action by a human operator (deciding to replace 2304 for example), and/or to communicate results through an Ethernet cable 2380 or wirelessly.

Figure 24:
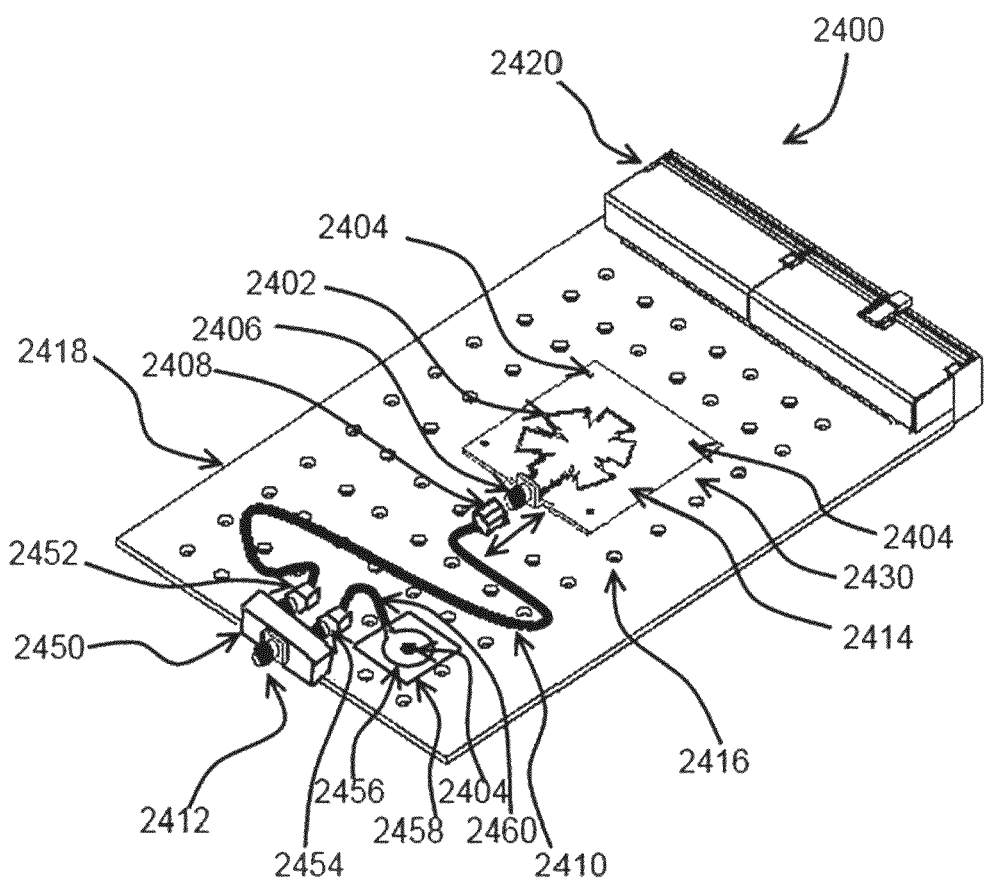
FIG. 24 illustrates an exemplary antenna card (PCB assembly) insertable into a slot and containing multiple precisely relocatable antennas combined into one output.
Figure 25:
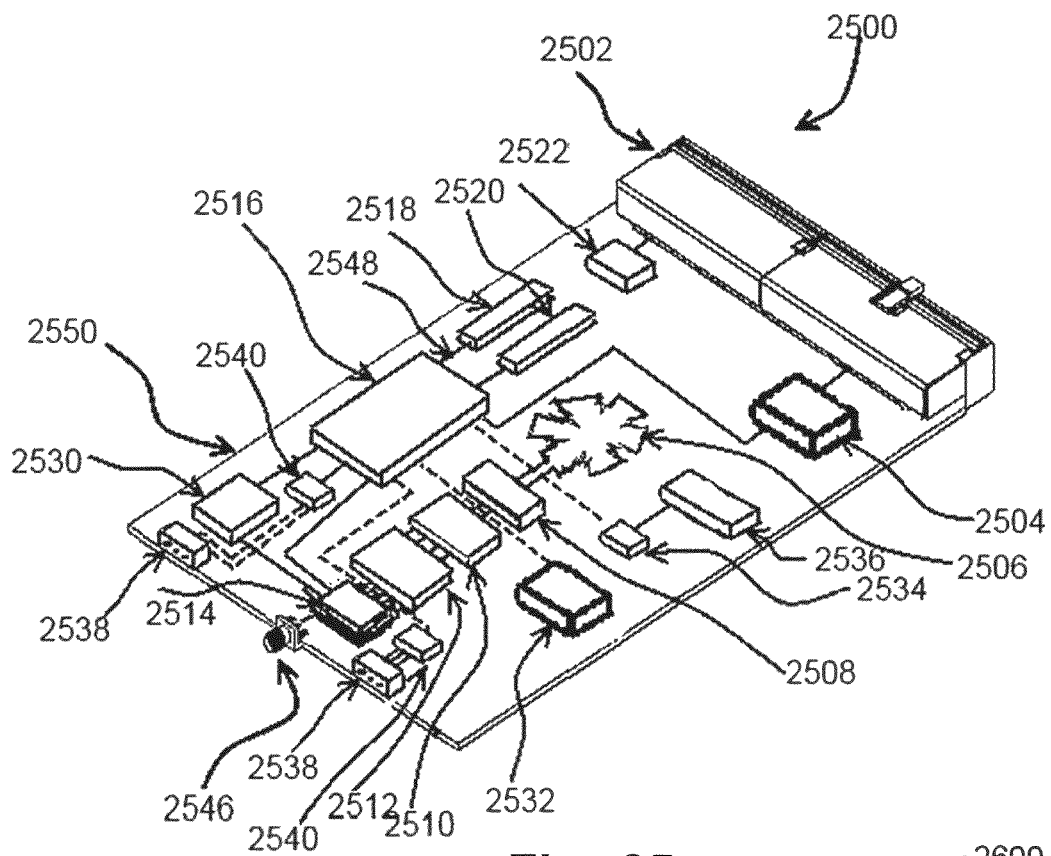
FIG. 25 illustrates an exemplary physical illustration of the circuit shown in FIG. 12 embodied in a PCB card (assembly) insertable into a slot.

FIG. 24 illustrates an exemplary antenna card 2400 containing two optionally emplaced, accurately spatially registered antennas 2458, 2414 and combining their output into one channel 2412 using optional component splitter/combiner 2450 mountable/dismountable on antenna card 2400. Other devices may be similarly added to antenna card 2400 such as LNA, Filters, Attenuators, surge suppressors, RF switches, and the like. The antenna card 2400 is configured for insertion into a slot in a card rack or chassis FIG. 25 illustrates a 3D view of the components shown at least in FIG. 12 placed on a PCB card assembly 2500 and suitable for insertion into a card rack cabinet or processor chassis. For the sake of brevity, the exemplary component names/functions are provided on pages 16-17 of this document and will not be repeated herewithin.

Figure 26:
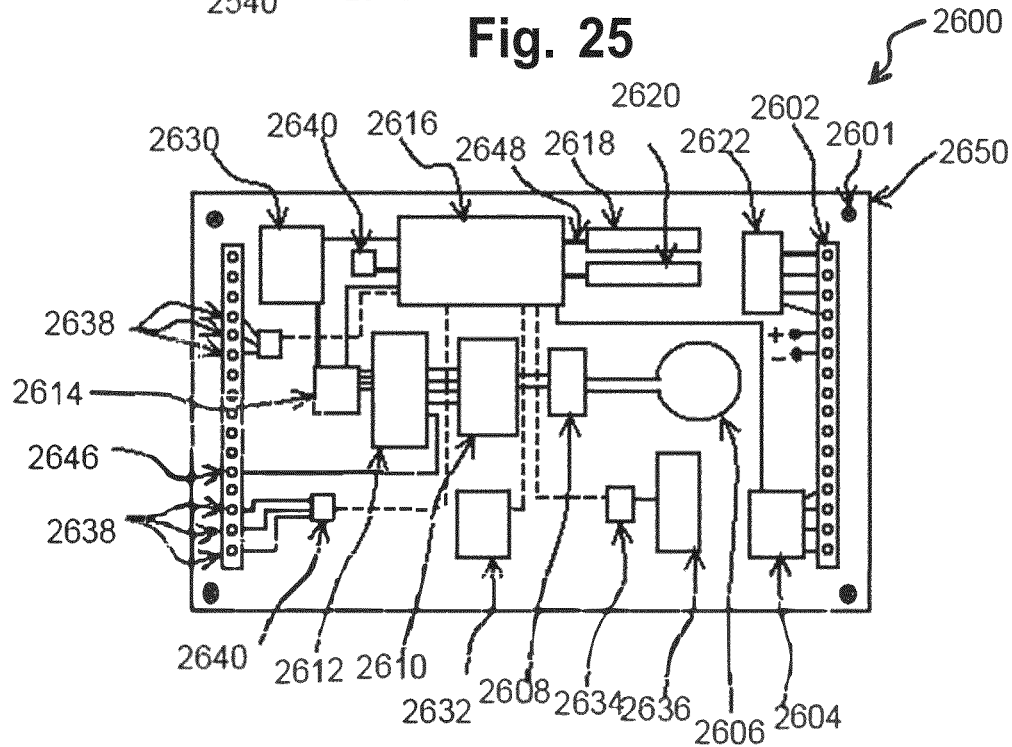
FIG. 26 illustrates an exemplary block diagram of the PCB card (assembly) of FIG. 25 that can be embodied in a mezzanine multi-chip or multi-die module.

FIG. 26 essentially illustrates a block diagram of the PCB card (assembly) 2500 of FIG. 25 that can be embodied in a mezzanine multi-chip or multi-die module. For the sake of brevity, the exemplary component names/functions are provided on page 17 of this document and will not be repeated herewithin.

Figure 27:
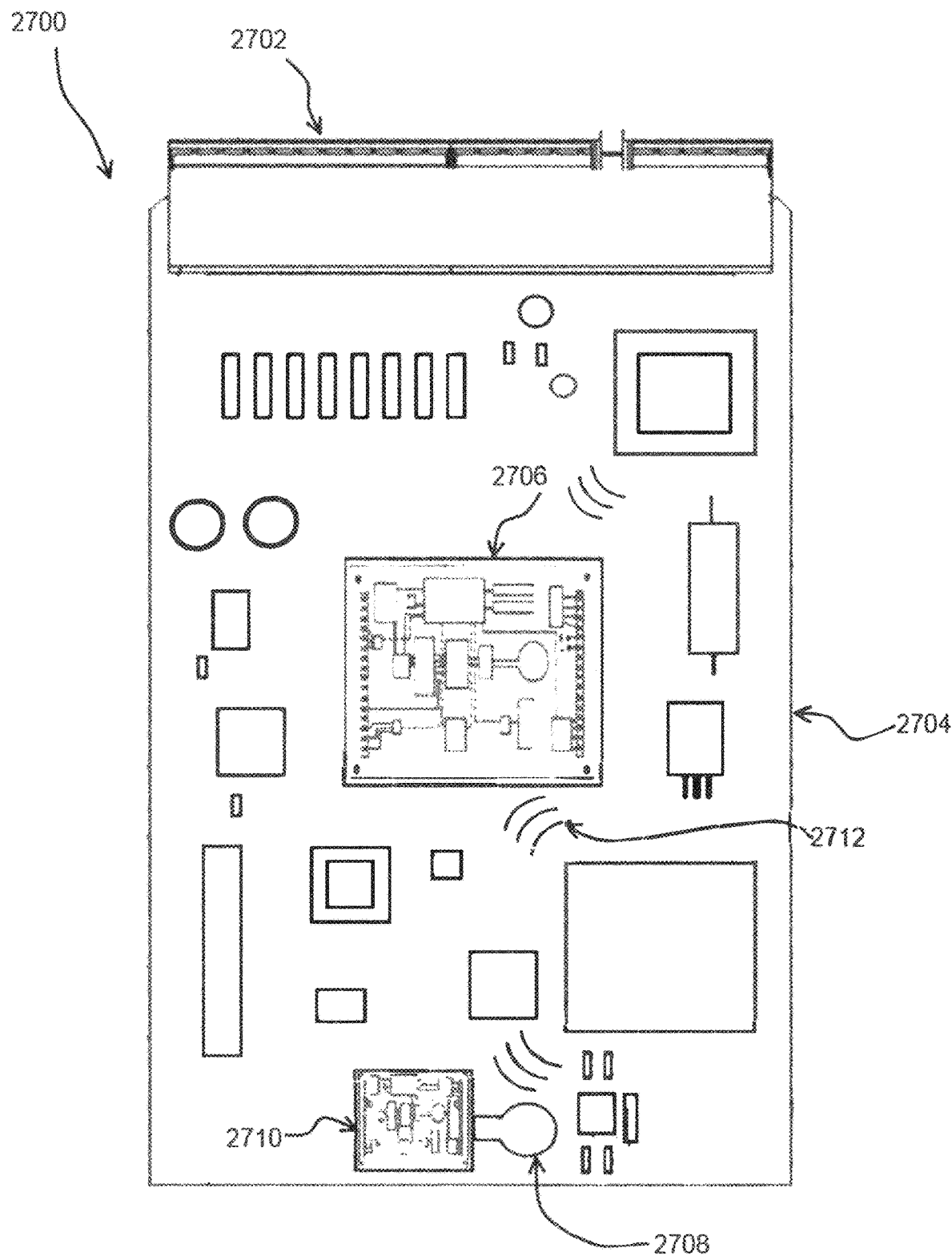
FIG. 27 illustrates an exemplary processing card with added RF processor modules and RF processor in chip form to process adjacent unintended emissions such as from nearby components.

FIG. 27 illustrates an exemplary processing card 2700 with added RF processing module 2706 and RF processor in chip form 2710 on the PCB substrate 2704 to process adjacent intended or unintended RF emissions such as 2712 from nearby components. The RF processor chip can be an integrated circuit and can be connected to an antenna 2708. Board connector 2702 is provided for insertion of the card 2700 into a slot.

In any of the embodiments, the card substrate can be a printed circuit board.

In any of the embodiments, the antenna substrate can be a printed circuit board.

In any of the embodiments, the antenna can be etched on a printed circuit board substrate.

In some embodiments, the antenna card is configured for insertion into a card slot within any one of a PCB card chassis, a rackmount card cage, a rackmount server chassis, a server case tower, a tower server chassis, and a modular storage network array.

In any of the embodiment, the card substrate that can be fastened through optional apertures (not shown) in addition to or as an alternative to edge connectors.

In some embodiments, electrical power necessary for operation of the antenna module and/or antenna card is acquired from a PCB card edge connector.

In an embodiment, an antenna card comprises an antenna module. The antenna module comprises an antenna configured to capture emissions of electromagnetic energy in a radio frequency (RF) range, an antenna substrate, the antenna being mounted on the antenna substrate, and an antenna connection member. The antenna card also comprises a card substrate and a means for detachably positioning the antenna module in a preselected zone on the card substrate.

A feature of this embodiment is that the means comprises an orthogonal array of first features in or on the card substrate and two or more second features in or on the antenna substrate, the two or more second features configured to mate with any two or more first features within the orthogonal array of first features during use of the antenna card.

A feature of this embodiment is that one from the first and second features is an aperture and an opposite one from the first and second features is a pin sized and shaped to be received within a respective aperture.

A feature of this embodiment is that the antenna substrate or the card substrate comprises a printed circuit board.

A feature of this embodiment is that the antenna card further comprises a backplane connector mounted on the card substrate the backplane connector configured to secure the antenna card within a chassis slot.

A feature of this embodiment is that the antenna card further comprises an RF processing member mounted on the card substrate and being operatively coupled to the antenna, the RF processing member comprising any one of a bandpass filter, a low noise amplifier (LNA), a highpass filter, a lowpass filter, a surge suppressor, an impedance matcher, and a splitter/combiner.

A feature of this embodiment is that the antenna can comprise any one of a loop antenna, a fractal antenna, a dipole antenna, a PIFA antenna, an irregular antenna, and an antenna array.

A feature of this embodiment is that the antenna card further comprises an interface connection member on the card substrate and a connection between the antenna connection member and the interface connection member.

A feature of this embodiment is that the means can comprise any one of an adhesive, a magnet and a hook and loop fastener.

A feature of this embodiment is that the means can comprise linear positioners that move the antenna module in one or more linear directions.

A feature of this embodiment is that the antenna card further comprises a void or a cutout in the card substrate.

The antenna card of claim 1, wherein the antenna connection member comprises an RF connector.

A feature of this embodiment is that antenna connection member comprises an RF connector and an RF cable having one end thereof coupled to the RF connector and another end thereof coupled to a connection on the card substrate.

A feature of this embodiment is that the antenna connection member comprises a connector on the card substrate and a mating connector on the antenna substrate.

A feature of this embodiment is that the antenna card further comprises a second antenna module, the second antenna module comprising a second antenna configured to capture emissions of electromagnetic energy in a radio frequency (RF) range, a second antenna substrate, the second antenna being mounted on the second antenna substrate, and a connection between the second antenna module and an RF connector.

In an embodiment, a circuit card assembly comprises a chassis with card slots, printed circuit board (PCB) assemblies inserted into some card slots, one or more antenna cards inserted into one or more remaining card slots, each of the one or more antenna cards comprises an antenna module comprising an antenna configured to capture emissions of electromagnetic energy in a radio frequency (RF) range, an antenna substrate, the antenna being mounted on the antenna substrate, and an antenna connection member. There is also a card substrate and a means for detachably positioning the antenna module in a preselected zone on the card substrate.

In an embodiment, a circuit card assembly comprises a chassis with card slots, printed circuit board (PCB) assemblies inserted into some card slots, a robotic mechanism mounted on the chassis, the robotic mechanism comprising an arm being manipulated for a movement over one or more locations on the one or more of the (PCB) assemblies, and an antenna mounted on an end of the arm, the antenna configured to capture emissions of electromagnetic energy in a radio frequency (RF) range from the one or more locations.

In an embodiment, a printed circuit board (PCB) assembly comprises a PCB substrate, a reconfigurable antenna disposed on the PCB substrate, the reconfigurable antenna comprising antenna wire elements reconfigured by RF MEMS switches, a controller coupled to the reconfigurable antenna, and a backplane connector operatively mounted on the OCB substrate.

In an embodiment, a control apparatus comprises an enclosure with card slots, an RF emissions processing module inserted into one slot from the slots, the RF emissions processing module comprising a substrate, a first antenna disposed on the substrate, and a controller disposed on the substrate and operatively coupled to the first antenna. The control apparatus further comprises a printed circuit board (PCB) assembly inserted into another slot from the slots, the PCB assembly comprising one or more antenna cards inserted into one or more remaining card slots, each of the one or more antenna card comprising an antenna module comprising a second antenna configured to capture emissions of electromagnetic energy in a radio frequency (RF) range, a second antenna substrate, the second antenna being mounted on the second antenna substrate, and an antenna connection member. The antenna card further comprising a card substrate and a means for detachably positioning the antenna module in a preselected zone on the card substrate, the second antenna being connected to the controller.

A feature of this embodiment is that the enclosure comprises any one of a PCB card chassis, a rackmount card cage, a rackmount server chassis, a server case tower, a tower server chassis, and a modular storage network array.

In an embodiment, a mobile communication device comprises a housing, a display, one or more cameras, one or more processors, a non-transitory computational medium comprising executable instructions that, when executed by the one or more processors, cause the one or more processors to perform operations, an antenna module comprising an antenna configured to capture emissions of electromagnetic energy in a radio frequency (RF) range emitted from the one or more processors, an antenna substrate, the antenna being mounted on the antenna substrate, and an antenna connection member. The mobile communication device further comprising a controller coupled to the antenna, the controller configured to receive and process the captured emissions of electromagnetic energy.

In an embodiment, a circuit card assembly comprises a sensor, configured, to capture emitted electromagnetic energy from one or more electrical devices, one or more processors or logic devices, an antenna, an emissions acquisition assembly, configured, to receive, in an analog form, unintended emissions of electromagnetic energy being given off by an electrical device and to covert the received unintended emissions into a digitized data, one or more processors, a non-transitory computational medium comprising executable instructions that, when executed by the one or more processors, cause the one or more processors to perform the steps of acquiring a spectral frequency region within a sample unintended emission, identifying a spectral frequency region within a sample unintended emission, measuring a value of a spectral parameter of the spectral frequency region in the sample unintended emission, determining, based on distinct changes in the values of the parameter, at least one of anomalous software, anomalous firmware, hardware degradation, RUL, anomalous circuitry of the electrical device, operation degradation, operation failure, and Remaining Useful Life, and reporting the determination to an external interface in at least one of a human recognizable output and a machine readable format.

In an embodiment, a computer comprises a processor, a screen, one or more logic devices, a radio frequency (RF) receiving and processing module integrated into the computer, the RF receiving and processing module receives emissions of an electromagnetic energy in RF range and at least processes the received RF emissions.

A compact, irregular, self-similar, reduced size, squeezed spaced together antenna and/or fractal antenna can be used in typically space constrained locations inside a chassis, benefiting from higher bandwidth and reduced space requirements. Similar antenna configurations include Irregular compressed curvature, magnetic dipole, loop or snowflake like shapes where size or area decreases for the same conductor length with less free space needed for same frequency response. It can be above the board-to-be-monitored with or without a metal ground plane, in a board layer underneath the part to be scrutinized (esp. if power or ground plane is deliberately absent substantially below the antenna), or between board and metal ground plane.

Some antennas or antenna modules may have means for matching of antenna impedance such as RF transformer or balun directly after antenna and may ne be shown in some figures.

The Health monitoring signature as exemplary pattern is typically acquired before the device is monitored/evaluated.

Energy collection measurements may be acquired over time such as day 1 . . . day n, continuously monitoring over life of device, and/or with a measurement interval continuously or periodically on a basis of samples=1/sec, 1/min, 1/hr, 1/day, 1/wk, 1/mon, 1/year, etc.

Signature changes over time for exemplary aging data include frequency shifts, broadening or narrowing width of operation state relevant identified peaks over time, amplitude down, amplitude down & then later back up and 'non-linear emission signatures'.

Antenna input based monitoring apparatus may be mounted onto a circuit board to be monitored, or on a CARRIER above board being monitored, on a Daughter card, mezzanine card, sub-enclosure, etc. It may monitor devices above, adjacent or below it.

Anomalous circuitry may include circuitry with failed chips, failed components, components which will or have failed at extreme temperatures experienced or to be experienced, chips of insufficient temperature grade, incorrect version of boards or chips, chips or boards with unneeded, unwanted or excessive functionality, security compromised boards running undesirable code, and the like.

Intended or unintended emission(s) from devices being monitored in a chassis or rack may be including other cards, chips, wire assemblies, connectors, discrete passive components, discrete active components not necessarily near the antenna. Antenna may be made of a specific size at a specific location, orientation, antenna type, and/or specific frequency response to monitor only emissions from one or more specific devices, deliberately minimizing coupling to other devices in the chassis or rack.

The monitoring card which may monitor electronic devices in its region of reception can be for health monitoring applications that may include, but not be limited to aging diagnostics, aging prognostics, verification of authenticity, counterfeit detection, Trojans, degraded parts, disabled parts, RUL, operational states, software version, software tampering, bugs, Rowhammer attacks, and/or emission of non-functional Radio frequency emission artifacts.

A data cable from the monitoring board may contains signature information from the system being monitored, which may include raw emissions data, processed emission data or algorithmic outputs relevant to devices being monitored within the system including comparison results with previous temporal measurements, baseline measurements or other measurements anticipated based on the mode of operation.

A connector may connect to additional cabling that interfaces with the monitoring board in the cases where the monitoring board has multiple outputs and may provide parallel data paths including multi-channel operation to provide enhanced data output and more emissions to be analyzed.

Spectrum frequency data or spectrum evaluation results (SER) may be transmitted digitally from monitoring card over a data cable to be used/analyzed by other devices connected to the data cable, possibly including other cards in enclosure.

An antenna receiving emissions may be near field or far field. Antenna type may include one or more of a loop, a dipole, a monopole, a strip, a plate, a patch, a non-fractal and/or a fractal or a myriad of other antenna types. It may be electronically or mechanically tuned to one or more frequencies or wavelengths for better response. It may further be used to sense resonances and then be electronically or mechanically tuned to enhance reception of the sensed resonances. Though typically registered in the same location to monitor a specific board within the system or multiple boards within the system and the Integrated Circuits (ICs) that are resident on those boards, it may be specifically located adjacent to selected chips, micro controllers, logic devices, analog devices or passive devices. There may be on antenna or multiple such antennas of the same or differing types. Antenna(s) may be connected via cables to the monitoring board and said antennas located elsewhere in the enclosure. Antennas may be configured to illuminate with RF energy in addition for the purpose of stimulating parts in its Electromagnetic Vicinity Of Influence (EVOI) to illicit re-emission of additional electromagnetic energy for the purpose of electronic system monitoring. The illumination energy may be used to temporarily or permanently disrupt operation of devices under its EVOI.

A Custom integration into an electronics enclosure or its door or cover, especially a removable/replaceable cover using an RF/EM see-through window in the enclosure may be used to acquire the RF emissions from the outside.

In the signature analysis phase the Electronic emission signature analysis is accomplished through algorithms that extract characteristic signature elements and examine them for indicators of aged circuitry characteristics. Established algorithms for signature element extraction can be active within the system.

In one exemplary embodiment, the unintended emission analysis hardware and software system may be configured above, adjacent, or below the boards or devices under test and use time domain analysis of emitted signals and/or frequency domain analysis of emitted signals. One exemplary embodiment may use harmonic phase analysis to assist in further determining if emission signatures can be the ones being compared with a higher degree of accuracy, some embodiments may use non-coherent signal integration techniques to further reduce the noise of received emissions. One exemplary embodiment may be directed towards estimating the loss of useful lifetime and total Remaining Useful Life as a result of activity due to exposure to excessive environmental parameters such as temperature, radiation, voltage, vibration, G-forces, etc. outside the stated limits of operation by the manufacturer. Another exemplary embodiment may be adapted to locate counterfeited electronic devices. Some embodiments may first locate devices with change indications, then examine them to determine if they can be properly used, even though they are modified.

To prepare the system for electromagnetic emission acquisition the following steps may be performed. Acquisition of electromagnetic emissions can proceed using automated measurement and logging equipment, such as for example the above described apparatus 1200, in a response to the appropriate driving stimuli. Appropriate sensitivity (less than that which saturates the LNA, A/D or other analog components) may be used for each individual frequency span. Appropriate frequency resolution may be used. High resolution bandwidth inspection and minimum number of frequency spans may be determined by the function and complexity of the DUTs. As an example, 1 Hz RBW and frequency spans can be typically used for high confidence in low complexity parts. Digital representations of electromagnetic emissions may be compared and contrasted with specific focus on emission homogeneity, consistency, and uniformity. This process may be automated. It is normal to have some variation across different date and lot codes but not normally in parts with the same date and lot code. Additional analyses may be performed on parts that exhibit anomalies in their radiated electromagnetic emissions. The acquisition of the DUT's electromagnetic emissions may be repeated multiple times and combined to decrease the amount of uncertainty.

The executable instructions, when executed by the one or more processors or logic devices, may also cause the one or more processors or logic devices to perform an additional step of electromagnetic emissions analysis including at least one of a spectrographic analysis, a time-frequency analysis, an electromagnetic emission radiation response analysis related to input signal variations, a phase analysis, an informatics analysis, and a statistical analysis.

The at least two different physical electrical devices may include at least one of a baseline electrical device and an unexamined electrical device, at least two different baseline electrical devices of a different type, at least two unexamined devices of the same type, at least two different baseline electrical devices of the same type, and at least two unexamined devices of a different type. The invention may simply monitor the devices emissions for a significant change based on the historical baseline received and established, for example, the sudden appearance of new peaks, the disappearance of peaks, apparent shifting of amplitude or frequency features such as in a single peak or groups of peaks, and the like.

In another exemplary embodiment, an apparatus comprises an attached or attachable antenna on a card; an emissions acquisition assembly, configured, to receive, in an analog form, unintended emissions of electromagnetic energy being given off by an electrical device and to covert the received unintended emissions into a digitized data; one or more processors; and a non-transitory computer readable medium comprising executable instructions that, when executed by the one or more processors, cause the one or more processors to perform the steps of: identifying a spectral frequency region within a sample unintended emission, measuring a value of a parameter of the spectral frequency region in the sample unintended emission, measuring value(s) of the parameter in one or more of subsequent unintended emissions, and determining, based on distinct changes in the values of the parameter, at least one of significant change or insignificant change of the electrical device.

The value of the parameter may change over time and/or the value of the parameter may differ across frequency ranges.

The emissions of distinct electronic components on a circuit board may be associated with the corresponding distinct physical electronic components on the circuit board.

The executable instructions, when executed by the one or more processors, may further cause the one or more processors to determine a type of and/or classify the electrical device.

The digital representations of electromagnetic emissions may be compared and contrasted with a specific focus on at least one of emission homogeneity, consistency, and uniformity.

The method may further comprise the step of providing a calibration electronics card specimen, the step of capturing emissions radiating from the calibration specimen and the step of defining a calibrating emission signature.

The method may further comprise the step of combining results of at least one of spectrographic analysis, frequency analysis, time-frequency analysis, electromagnetic emission radiation response analysis, input signal variations, phase analysis, informatics analysis, and statistical analysis for at least one of the feature values with results of at least one of spectrographic analysis, frequency analysis, time-frequency analysis, electromagnetic emission radiation response analysis, input signal variations, phase analysis, informatics analysis, and statistical analysis for at least one of another feature value in at least one frequency region from at least one time interval.

In one exemplary embodiment, the highly sensitive receiver further uses Digital Signal Processing (DSP) hardware to execute algorithms to further enhance the sensitivity of the receiver.

In another exemplary embodiment, the RF energy collection apparatus utilizes DSP filtering techniques to prepare the collected data for further processing by DSP algorithms.

One embodiment directed to improve sensitivity of the receiver uses a Fast Fourier Transform (FFT).

In another exemplary embodiment, the FFT is utilized in excess of 1 Million points.

In another exemplary embodiment, the FFT is utilized in excess of 254 Thousand points.

In another exemplary embodiment, the FFT is utilized in excess of 16 thousand points.

In another exemplary embodiment, the FFT is implemented on an embedded chip within the RF collection apparatus.

In another exemplary embodiment, an apparatus uses unintended electromagnetic energy in the RF spectrum to detect aging in electrical and electronic devices.

In another exemplary embodiment, an apparatus detects aging in electrical and electronic devices and includes means for comparing signature of emitted RF energy with baseline RF characteristics.

In another exemplary embodiment, an automated apparatus may be configured to accomplish the test of multiple parts, systems or subsystems within an operational system, subsystem or devices simultaneously for the existence of unacceptably aged discrete semiconductor, integrated circuit, printed circuit board, circuit board assembly, system, sub-systems generally.

In another exemplary embodiment, an apparatus or method may be configured to inspect fully populated circuit boards to determine if the board contains the proper software or firmware when compared to a modified or unmodified standard.

In another exemplary embodiment, an apparatus may be configured to inspect fully populated circuit board and determine specifically what improper software is associated with which parts on the board and which parts contain proper, desired or authentic software, firmware or hardware patterns.

In another exemplary embodiment, a method is provided for active disablement of the equipment card, rack or system under monitoring containing detected damaged, compromised, modified, and/or an improper state of software, firmware, hardware, excessively aged components, discrete semiconductors, integrated circuits, printed circuit boards, circuit board assemblys, systems, sub-systems in electrical and electronic devices that may include the continuous, sporadic, conditional, periodic, and/or occasional monitoring of emissions from circuitry.

In another exemplary embodiment, a completed equipment board or system is analyzed to determine what component versions can be present and operational, and/or if all subsystems and functionality is present using their emitted signatures.

In another exemplary embodiment, a completed Electronic And Especially Avionics equipment board or system is analyzed to determine the relative or absolute location of a software or hardware component based on its emissions or a comparison of its emissions with a known standard.

Another exemplary embodiment provides an apparatus, wherein the receiver is a radio frequency (RF) receiver configured to extract a desired target frequency from a raw signal emitted by an Electronic device and received from the apparatus' antenna.

Another exemplary embodiment provides an apparatus, wherein the at least one processor includes a Field Programmable Gate Array (FPGA) configured to convert the target frequency to a baseband frequency.

Another exemplary embodiment provides an apparatus, wherein the at least one processor is configured to transform a time domain digital waveform of the emitted spectrum from the at least one electrical device to a frequency domain of interest.

Another exemplary embodiment provides a computer-implemented method used to differentiate RF harmonic content of the equipment source from electro-magnetic background noise.

Another exemplary embodiment provides an apparatus, wherein such predetermined electronic equipment contains at least one of an oscillator, a voltage control oscillator, a ceramic resonator, a local oscillator, a high precision oscillator of at least $10^{-6}$, a oscillator with accuracy of $10^{-9}$ or better created by an atomic clock, TXCO, GPS stabilized clock, and a stable local oscillator.

Another exemplary embodiment provides the above system wherein the means for determining the condition of a electrically powered device includes: (a) a first means for collecting RF energy emitted from the electrically powered device; (b) a second means for matching collected RF energy to a set of predetermined parameters; and (c) a third means for determining if a match to the predetermined set of parameters is sufficient.

Another exemplary embodiment provides the above system wherein the first means includes an automated mechanism, a robotic mechanism, an electrically steerable antenna, and/or a mechanically steerable antenna for collecting the RF energy from the device.

Another exemplary embodiment provides a method wherein the step of determining the device containing circuitry includes the step of analyzing at least one of frequency locations of emissions components, phases of emissions, cross-modulation and intermodulation components generated by the internal circuitry, shape of any individual emission, quality factors of any individual emissions or timing characteristics of emissions.

Another exemplary embodiment provides a method wherein the step of establishing the baseline RF characteristics includes the step of large scale comparison of spectral emissions and the step of reducing the large scale comparison to a single scalar value.

Another exemplary embodiment is configured to operate wherein the at least one emission is at least one of Unintended properties of intended emissions and Unintended emissions.

Another exemplary embodiment is configured to operate wherein the unintended electromagnetic energy is in a Radio Frequency spectrum.

Another exemplary embodiment is configured to operate wherein the at least one emission is at least one of a microwave or millimeter emission.

Another exemplary embodiment is configured to include a low noise amplifier on a card attached to an antenna on the same card.

Another exemplary embodiment is configured to include a bandpass filter, highpass filter, or lowpass filter on a card attached to an antenna on the same card.

Another exemplary embodiment is configured to operate in a manner wherein the means for processing the emission signal resides on a different card from the antenna receiving the emission.

Another exemplary embodiment is configured to operate in a manner wherein the received emission is obtained from the backplane traces.

Another exemplary embodiment is configured to operate in a manner wherein the received emission is obtained from a connector configured to connect to a backplane using standard rackmount connectors.

Another exemplary embodiment is configured to operate in a manner wherein the received emission is obtained from a removable antenna configured to be positioned anywhere on a rackmount card.

Another exemplary embodiment is configured to operate in a manner wherein the received emission is obtained from a removable antenna configured to be positioned precisely in at least one of a plurality of predetermined locations and predetermined orientations on a rackmount card.

In another exemplary embodiment, the system includes at least one back up device so as to facilitate prompt switchover thereto.

In another exemplary embodiment, the system includes a database of emission data derived from free field emission data, near field emission data, or far field emission data of at least two Electronic component that have been pre-measured.

Another exemplary embodiment is envisioned, wherein the RF collection means within the rackmount card has a sensitivity of better than −149 dBm.

Another exemplary embodiment provides a method, further including the step of establishing the baseline RF characteristics representative of the semiconductor based device or system.

Another exemplary embodiment provides a method, wherein the step of establishing the baseline RF characteristics includes the step of obtaining local spectral power density statistics.

Another exemplary embodiment provides a method, wherein the statistical features acquired from electronic equipment or components within the electronic equipment includes at least one of Emission Frequency Location, Emission Peak Magnitude, Emission Phase Noise, Emission Symmetry, Skewness, and Emission Local Noise Floor. The apparatus of claim 1 adapted to monitor an electrical equipment rack for correct operation.

The various above described embodiments have applicability in many applications. In one application, the antenna module card or an antenna module mounted on an end of a robotic arm monitors one or more PCB assemblies or cards within a control apparatus for correct operation. The monitoring can yield assessment of the aging of one or more component on a specific PCB assembly or even one or more complete PCB assembly by capturing RF emissions, analyzing RF signature characteristics of such emissions and at least comparing these analyzed characteristics against a baseline measurement or a certified PCB assembly. The antenna card is insertable into a card slot within the chassis and for intrusion-free monitoring of PCB assemblies.

In one application, particularly when the control apparatus is of a redundant control type in avionics' environment, the disclosed subject matter can be adapted to cause a redundancy switchover based on a detection of an incorrect PCB assembly operation.

In one application, the antenna card does not have to be continuously present within the enclosure of the control apparatus during operation thereof and can be only used as an inspection tool during a periodic scheduled testing of such control apparatus.

In one application, the antenna card be adapted to monitor operation of the components within a mobile communication device, for example such as a mobile phone.

In one application, the antenna card be adapted to monitor operation of the components within a computer.

In one application, the antenna card be adapted to monitor operation of the components within a manufacturing equipment.

In one application, the antenna card be adapted to monitor operation of the components within an automobile.

In one application, the antenna card be adapted to monitor operation of the components within a locomotive, a control cab car of a trailer car in rail train operations.

In one application, an antenna module can be easily replaced by a different antenna module to generate RF signature with different characteristics.

Persons of ordinary skill in the art may appreciate that, in combination with the examples described in the embodiments herein, units and algorithm steps can be implemented by electronic hardware, computer software, or a combination thereof. In order to clearly describe the interchangeability between the hardware and the software, compositions and steps of every embodiment have been generally described according to functions in the foregoing description. Whether these functions are performed using hardware or software depends on particular applications and design constraints of the technical solutions. A person skilled in the art may use different methods to implement the described functions for each specific application. However, such implementation should not be considered as beyond the scope of the present invention.

At least some of the functionality, for example, such as the process of processing RF emission signature characteristics, may be performed by hardware or software. In case of an implementation in software, a single or multiple standard microprocessors or microcontrollers configuration may be used. The disclosed subject matter can be implemented by single or multiple algorithms. Tangible computer readable medium means any physical object or computer element that can store and/or execute computer instructions. Examples of tangible computer readable medium include, but not limited to, a compact disc (CD), digital versatile disc (DVD), blu-ray disc (BD), usb floppy drive, floppy disk, random access memory (RAM), read-only memory (ROM), erasable programmable read-only memory (EPROM), optical fiber, etc. It should be noted that the tangible computer readable medium may even be paper or other suitable medium in which the instructions can be electronically captured, such as optical scanning. Where optical scanning occurs, the instructions may be compiled, interpreted, or otherwise processed in a suitable manner, if necessary, and then stored in computer memory.

The disclosed method may be implemented in the form of a software stored on a computer-readable non-transitory information storage medium such as an optical or magnetic disk, a non-volatile memory (e.g., Flash or ROM), RAM, and other forms of volatile memory. The information storage medium may be an internal part of the computer, a removable external element coupled to the computer, or unit that is remotely accessible via a wired or wireless network.

Program code for carrying out operations for aspects of various embodiments may be written in any combination of one or more programming languages, including an object oriented programming language, such as Java, Smalltalk, C++, or the like, and conventional procedural programming languages, such as the "C" programming language or similar programming languages. In accordance with various implementations, the program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

It should be appreciated that reference throughout this specification to "one embodiment" or "an embodiment" means that a particular feature, structure or characteristic described in connection with the embodiment is included in at least one embodiment of the disclosed subject matter. Therefore, it is emphasized and should be appreciated that two or more references to "an embodiment" or "one embodiment" or "another exemplary embodiment" in various portions of this specification are not necessarily all referring to the same embodiment or the same variation. Furthermore, the particular features, structures or characteristics may be combined as suitable in one or more embodiments of the disclosed subject matter.

The chosen exemplary embodiments of the claimed invention have been described and illustrated for practical purposes so as to enable any person skilled in the art to which it pertains to make and use the same. It is therefore intended that all matters in the foregoing description and shown in the accompanying drawings be interpreted as illustrative and not in a limiting sense. It will be understood that variations, modifications, equivalents and substitutions for components of the specifically described exemplary embodiments of the invention may be made by those skilled in the art without departing from the spirit and scope of the invention as set forth in the appended claims.

Any element in a claim that does not explicitly state "means for" performing a specified function, or "step for" performing a specified function, is not to be interpreted as a "means" or "step" clause as specified in 35 U.S.C. § 112, ¶ 6. In particular, any use of "step of" in the claims is not intended to invoke the provision of 35 U.S.C. § 112, ¶ 6.

Furthermore, the Abstract is not intended to be limiting as to the scope of the claimed invention and is for the purpose of quickly determining the nature of the claimed invention.

What is claimed is:

1. An antenna card, comprising:
   an antenna module, comprising:
      an antenna configured to capture emissions of electromagnetic energy in a radio frequency (RF) range,
      an antenna substrate, said antenna being mounted on said antenna substrate, and
      an antenna connection member;
   a card substrate; and
   a means for detachably positioning said antenna module in a preselected zone on said card substrate.

2. The antenna card of claim 1, wherein said means comprises an orthogonal array of first features in or on said card substrate and two or more second features in or on said antenna substrate, said two or more second features configured to mate with any two or more first features within said orthogonal array of first features during use of said antenna card.

3. The antenna card of claim 2, wherein one feature from said first and second features is an aperture and an opposite one feature from said first and second features is a pin sized and shaped to be received within said aperture.

4. The antenna card of claim 1, wherein said antenna substrate or said card substrate comprises a printed circuit board.

5. The antenna card of claim 1, further comprising a backplane connector mounted on said card substrate, said backplane connector configured to secure said antenna card within a chassis slot.

6. The antenna card of claim 1, further comprising an RF processing member mounted on said card substrate and being operatively coupled to said antenna, said RF processing member comprising any one of a bandpass filter, a low noise amplifier (LNA), a highpass filter, a lowpass filter, a surge suppressor, an impedance matcher, and a splitter/combiner.

7. The antenna card of claim 1, wherein said antenna comprises any one of a loop antenna, a fractal antenna, a dipole antenna, a PIFA antenna, an irregular antenna, and an antenna array.

8. The antenna card of claim 1, further comprising an interface connection member on said card substrate and a connection between said antenna connection member and said interface connection member.

9. The antenna card of claim 1, wherein said means comprises any one of an adhesive, a magnet and a hook and loop fastener.

10. The antenna card of claim 1, wherein said means comprises linear positioners that move said antenna module in one or more linear directions.

11. The antenna card of claim 1, further comprising a void or a cutout in said card substrate.

12. The antenna card of claim 1, wherein said antenna connection member comprises an RF connector.

13. The antenna card of claim 1, wherein said antenna connection member comprises an RF connector and an RF cable having one end thereof coupled to said RF connector and another end thereof coupled to a connection on said card substrate.

14. The antenna card of claim 1, wherein said antenna connection member comprises a connector on said card substrate and a mating connector on said antenna substrate.

15. The antenna card of claim 1, further comprising a second antenna module, said second antenna module comprising a second antenna configured to capture emissions of electromagnetic energy in a radio frequency (RF) range, a second antenna substrate, said second antenna being mounted on said second antenna substrate, and a connection between said second antenna module and an RF connector.

16. A circuit card assembly, comprising:
   a chassis with card slots;
   printed circuit board (PCB) assemblies inserted into some card slots;
   one or more antenna cards inserted into one or more remaining card slots, each of said one or more remaining card slots comprises:
      an antenna module, comprising:
         an antenna configured to capture emissions of electromagnetic energy in a radio frequency (RF) range,
         an antenna substrate, said antenna being mounted on said antenna substrate, and
         an antenna connection member;
      a card substrate; and
      a means for detachably positioning said antenna module in a preselected zone on said card substrate.

17. A control apparatus, comprising:
   an enclosure with card slots;
   an RF emissions processing module inserted into one slot from said slots, said RF emissions processing module comprising:
      a substrate,
      a first antenna disposed on said substrate, and
      a controller disposed on said substrate and operatively coupled to said first antenna;
   a printed circuit board (PCB) assembly inserted into another slot from said slots, said PCB assembly comprising:
      one or more antenna cards, each of said one or more antenna cards comprising:
         an antenna module, comprising:
            a second antenna configured to capture emissions of electromagnetic energy in a radio frequency (RF) range,
            a second antenna substrate, said second antenna being mounted on said second antenna substrate, and
            an antenna connection member;
         a card substrate; and
         a means for detachably positioning said antenna module in a preselected zone on said card substrate;
   said second antenna being connected to said controller.

18. The control apparatus of claim 17, wherein said enclosure comprises any one of a PCB card chassis, a rackmount card cage, a rackmount server chassis, a server case tower, a tower server chassis, and a modular storage network array.

* * * * *